(12) United States Patent
Tanaka et al.

(10) Patent No.: US 7,547,929 B2
(45) Date of Patent: Jun. 16, 2009

(54) SEMICONDUCTOR HBT MMIC DEVICE AND SEMICONDUCTOR MODULE

(75) Inventors: Kenichi Tanaka, Kodaira (JP);
Hidetoshi Matsumoto, Kokubunji (JP);
Isao Ohbu, Sagamihara (JP); Kazuhiro Mochizuki, Tokyo (JP); Tomonori Tanoue, Machida (JP); Chisaki Takubo, Kodaira (JP); Hiroyuki Uchiyama, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 122 days.

(21) Appl. No.: 11/247,234

(22) Filed: Oct. 12, 2005

(65) Prior Publication Data
US 2006/0081879 A1 Apr. 20, 2006

(30) Foreign Application Priority Data
Oct. 15, 2004 (JP) .............................. 2004-301225

(51) Int. Cl.
*H01L 29/40* (2006.01)
(52) U.S. Cl. .................. 257/197; 257/621; 257/774
(58) Field of Classification Search ............... 257/197, 257/511, 774, 621
See application file for complete search history.

(56) References Cited

U.S. PATENT DOCUMENTS

| | | | | | |
|---|---|---|---|---|---|
| 4,505,799 | A | * | 3/1985 | Baxter | 204/416 |
| 5,426,072 | A | * | 6/1995 | Finnila | 438/107 |
| 5,696,466 | A | * | 12/1997 | Li | 330/286 |
| 5,841,197 | A | * | 11/1998 | Adamic, Jr. | 257/777 |
| 6,002,147 | A | * | 12/1999 | Iovdalsky et al. | 257/276 |
| 2003/0214016 | A1 | * | 11/2003 | Kiaei et al. | 257/587 |
| 2004/0212034 | A1 | * | 10/2004 | Mochizuki et al. | 257/502 |
| 2005/0146049 | A1 | * | 7/2005 | Kripesh et al. | 257/776 |

FOREIGN PATENT DOCUMENTS

JP 06-204449 7/1994
JP 2001-21667 8/2001

* cited by examiner

*Primary Examiner*—Evan Pert
*Assistant Examiner*—Tan N Tran
(74) *Attorney, Agent, or Firm*—Antonelli, Terry, Stout & Kraus, LLP.

(57) ABSTRACT

The present invention provides a semiconductor device which comprises active components, passive components, wiring lines and electrodes and are satisfactory in terms of mechanical strength, miniaturization and thermal stability. In the semiconductor device, openings are formed just below active components. These openings are filled with conductor layers. Conductor layers are also formed where openings are not formed.

3 Claims, 20 Drawing Sheets

SEMICONDUCTOR HBT MMIC DEVICE AND SEMICONDUCTOR MODULE

CLAIM OF PRIORITY

The present application claims priority from Japanese application JP 2004-301225 filed on Oct. 15, 2004, the content of which is hereby incorporated by reference into this application.

BACKGROUND OF THE INVENTION

1. Field of the Invention

The present invention relates to a small-sized high reliability semiconductor device, a manufacturing method thereof and a semiconductor module which uses the same.

2. Description of the Related Art

Recently, along with rapidly growing demands for mobile communication apparatus, power amplifiers for them have become a target of energetic research and development activities. To meet the needs for smaller communication apparatus, monolithic microwave integrated circuits (MMICs), which are small semiconductor chips with built-in passive components, are incorporated in power amplifier modules. In these ICs, heterojunction bipolar transistors (HBTs) are mainly used since they allow high power densities and miniaturization. Note that hereinafter in the present specification, monolithic microwave integrated circuits and heterojunction bipolar transistors are abbreviated as MMICs and HBTs. respectively.

In particular, in miniaturization-oriented power amplifier modules, MMICs are mounted face up on ceramic substrates by using metal bumps. Typical examples of this technique are disclosed in, for example, Japanese Patent Laid-Open No. 1994-204449 (Patent Document 1) and Japanese Patent Laid-Open No. 2001-2106677 (Patent Document 2).

<Patent Document 1> Japanese Patent Laid-Open No. 1994-204449

<Patent Document 2> Japanese Patent Laid-Open No. 2001-2106677

From a practical point of view, let us review the structures of HBT-used conventional semiconductor modules and make their problems clear. Firstly, consider a face-down configuration in which a semiconductor device having electrodes, wirings and passive components as well as active components formed on the semiconductor substrate is electrically connected to the module substrate by using what are called bumps and made of a thick conductor layer. This configuration has a structural problem that the conductor layers required to connect the components and electrical members to the module substrate differ in thickness namely due to the different thicknesses of the components and electrical members. Accordingly, it is difficult to secure the mechanical strength of the MMIC itself. This causes some difficulties in reliability. In addition, since semiconductor substrate is connected to the MMIC side via bumps, electrical contact points must be formed peripherally. Resistances are introduced in proportion to the number of such contact points. These many electrical contact points are disadvantageous in terms of durability, too.

Prior art structures have a problem in terms of usability, too. For example, if a semiconductor substrate is mounted face up on an MMIC substrate via bumps, other components such as passive elememts can not be formed on the back side of the semiconductor substrate before bumps are formed thereon. Therefore, it is not possible to form wiring lines, etc. on the back side of the semiconductor substrate. In addition, if no bump is formed below the active component, that is, all bumps are formed on the back side of the semiconductor substrate only to connect components to the module substrate, thermal radiation from the active component in the MMIC to the back side of the semiconductor substrate may not be satisfactory, resulting in unstable operation of the active component.

SUMMARY OF THE INVENTION

With the above-mentioned background behind, a first object of the present invention is to provide a semiconductor device which has active and passive components, wiring lines and electrodes and is satisfactory in terms of mechanical strength, miniaturization and thermal stability. A second object of the present invention is to provide a method of manufacturing a semiconductor device which has active and passive components, wiring lines and electrodes and is satisfactory in terms of mechanical strength, miniaturization and thermal stability. A third object of the present invention is to provide a semiconductor module which incorporates a semiconductor device having active and passive components, wiring lines and electrodes and is satisfactory in terms of mechanical strength, miniaturization and thermal stability.

The following makes a summary of the present invention. According to the present invention, there is provided a semiconductor device which comprises: a semiconductor substrate having at least a semiconductor component on a first surface thereof; an opening which is present on a second surface of the semiconductor substrate and located so as to face the semiconductor component wherein the second surface is opposite to the first surface; a first conductor layer filled in the opening; and second conductor layers which are present on the second surface of the semiconductor substrate and located where the first opening and the first conductor layer are not present. The first conductor layer is electrically connected to the semiconductor component formed on the first surface.

An aspect of the present invention is to facilitate miniaturization of the semiconductor device by forming an opening just below an active component while another aspect is to raise the thermal radiating performance by filling the opening with the first conductor. In addition to these aspects, second conductor layers are formed where no opening is formed in order to secure the mechanical strength of the semiconductor device. A desired number of second conductor layers are formed according to the planar dimension of the semiconductor substrate depending on the application. On the back side of the semiconductor substrate, second conductor layers are located so as to face passive components, wiring lines and electrodes formed on the top side of the semiconductor substrate. To secure the mechanical strength, second conductor layers may also be formed usefully in appropriate places where electrical members such as passive components, wiring lines and electrodes are not formed on the top side. Since such second conductor layers are not provided with via holes to be filled by them, they are formed directly on the back side of the semiconductor substrate.

Usually, the first conductor to fill the aforementioned opening is made of two or more kinds of metals. Most preferably, for example, one meal is gold or copper superior in electrical and thermal conductivities and the other metal is a material which can serve as a barrier metal for gold and copper, that is, can form a metal layer which prevent impurities from diffusing from the other metal layer (gold or copper in this case) into the semiconductor layer. For example, Pt, Ti, WSi, Cr, Ta, Ti, Pt, Ni or the like may be used. Common technology can be used to form the first conductor layer.

The following shows the preferable size of the first conductor layer to be filled in the opening. Here, the size means the size of its cross section taken in parallel to the first surface (and second surface) of the semiconductor substrate. In the cross sectional view, the size corresponds to the width of the cross section measured in parallel to the first surface (and second surface) of the semiconductor substrate. The width of the opening just below the active component is designed to be larger than the width of the active component. The width of the active component means its width measured in parallel to the first surface (and second surface) of the semiconductor conductor.

In view of reducing the thermal resistance and enhancing the mechanical strength, it is preferable to enlarge the size of the first conductor layer. Practically, the size is determined by considering the size and layout of the MMIC design. As for each second conductor layer formed on the back side of the semiconductor substrate so as to face a passive component, wiring line or electrode on the top side of the semiconductor substrate, its size is satisfactory unless it is designed to be smaller than the minimum allowable resist size.

Openings may be filled until projections occur from the back surface of the semiconductor substrate. These projections make it easier to integrate other electrical members on the back side of the semiconductor substrate. The maximum height from the back side of the semiconductor substrate is dependent on the maximum allowable resist thickness.

According to the present invention, there is provided a semiconductor device manufacturing method which comprises the steps of: preparing a semiconductor substrate having at least a semiconductor component formed on the top side thereof;

exposing the semiconductor substrate except for the semiconductor component;

coating the semiconductor substrate with a dielectric film;

selectively removing the dielectric film from a desired area;

coating the thus prepared semiconductor substrate with a first metal layer;

selectively removing the first metal layer so that at least the area from which the dielectric film was selectively removed remains coated with the first metal layer;

forming an opening from the back side of the semiconductor substrate so as to face the area where the first metal layer is present; and filling the opening with a conductor layer which is electrically connected to the first metal layer.

According to the present invention, there is provided a semiconductor module comprising a semiconductor substrate having at least a semiconductor component formed thereon, wherein:

conductor layers connected respectively to desired regions of the semiconductor component are brought out so as to come out from the surface opposite to the surface on which the semiconductor component of the semiconductor substrate is mounted; and the ends of the conductor layers come out from the surface opposite to the surface on which the semiconductor component of the semiconductor substrate is mounted are electrically connected to a metal pad on the module substrate through a conductor layer filled in via hole.

Preferably, said conductor layers connected respectively to desired regions of the semiconductor component are brought out through via holes formed though the semiconductor substrate.

As described in this specification, this packaging is very useful when the semiconductor component is a heterojunction bipolar transistor.

According to the present invention, it is possible to provide a semiconductor device which is satisfactory in terms of mechanical strength, miniaturization and thermal stability. According to another aspect of the present invention, it is possible to provide a manufacturing method capable of manufacturing a semiconductor device which is satisfactory in terms of mechanical strength, miniaturization and thermal stability. According to yet another aspect of the present invention, it is possible to provide a semiconductor module which is satisfactory in terms of mechanical strength, miniaturization and thermal stability.

BRIEF DESCRIPTION OF THE DRAWINGS

Other objects and advantages of the invention will become apparent from the following description of embodiments with reference to the accompanying drawings in which.

DETAIL DESCRIPTION OF THE INVENTION

Prior to proceeding to specific embodiments of the present invention, the following provides a supplementary description of the main points of the present invention.

Figure 1:
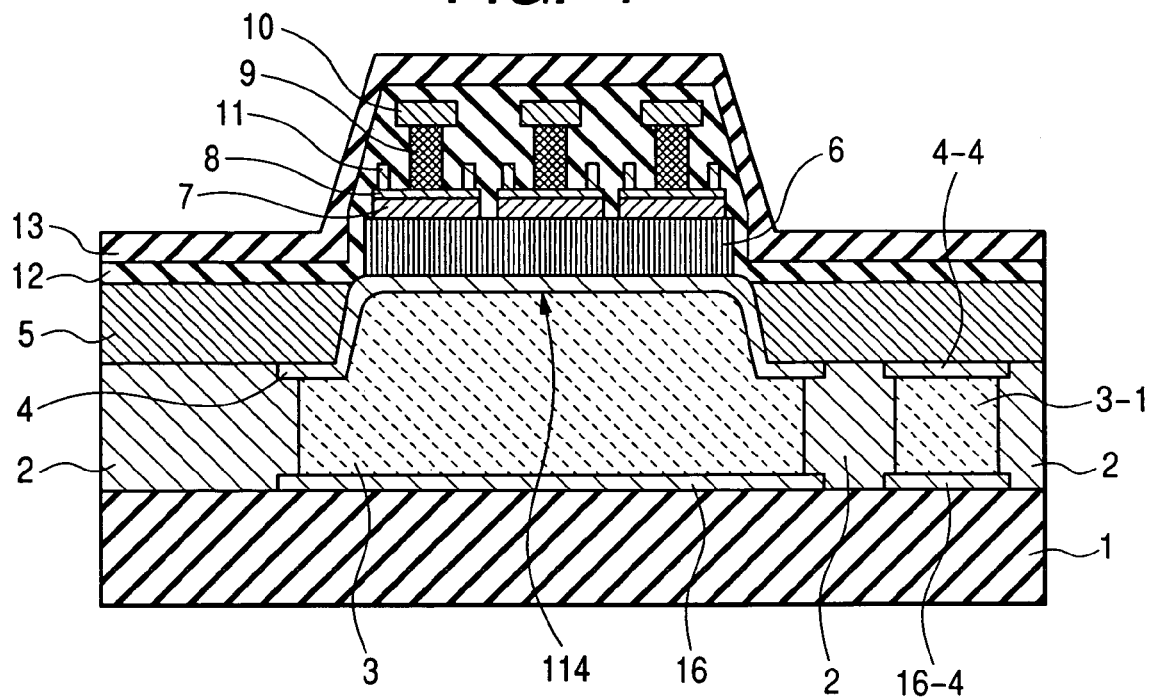
FIG. 1 is a longitudinal cross-sectional view of a collector top HBT in a semiconductor device embodiment of the present invention.

FIG. 1 is a cross sectional view of a main portion of an embodiment of the present invention wherein a MMIC is mounted on a module substrate. The semiconductor substrate 5 of the MMIC is attached to the module substrate 1 via a so-called bump 3. In this example, the following configuration is very important. In short, while an emitter via hole 114 is formed on the back side of the semiconductor substrate 5, it is located so as to face the active region of a HBT. The emitter via hole 114 is filled with the bump 3 (denoted as the first conductor layer in this specification) and the first conductor layer 3 is made so high as to exceed the thickness of the semiconductor substrate 5. Further, a bump 3-1 (denoted as a second conductor layer in this specification) is formed outside the place which faces the active region of the HBT. On the module substrate 1, electrodes 16 and 16-4 are formed. To them, the first conductor layer 3 and the second conductor layer 3-1 are connected respectively. Reference numeral 4-4 refers to an electrode pad which is formed on the semiconductor substrate 5 for the second conductor layer. In this example, the space between the semiconductor substrate 5 and the module substrate 1 is filled with a dielectric filler 2 to raise the reliability (for example, in terms of mechanical strength).

The active region itself of the HBT employs a conventional but satisfactory structure as briefly described below. In this example, three HBTs (HBT1, HBT2 and HBY3) are connected in parallel. On a sub-emitter layer 6 formed on the semiconductor substrate 5, emitter layers 7, base layers 8 and collector layers 9 are formed. The sub-emitter layer 6 is connected to a back side electrode 4 while the three collector electrodes 10 are joined together and connected to a wiring line. Due to the section selected, this cross-sectional view does not show how the collector electrodes are connected to the wiring line. The wiring line for the collectors is connected to a back side electrode via a pad. Likewise, the three base electrodes 11 are joined together and connected to a wiring line. Due to the section selected, this cross-sectional view also does not show how the base electrodes are connected to the wiring line. The active region of the HBT is covered by interlayer dielectric films 12 and 13. By using the interlayer dielectric films 12 and 13, wiring lines and others are distributed although they are not shown in this cross-sectional diagram. The second conductor layer 3-1 may be used to bring out the base or the collector. It may also be formed as a physical bump to merely support the semiconductor substrate 5. Its purpose and conformation are determined according to the design of the semiconductor module. In this meaning, the configuration of FIG. 1 shows the basic philosophy of the present invention. Such a structure of the present invention provides the following merits.

An aspect of the present invention secures mechanical strength. This aspect lies in that in a semiconductor device having active components, passive components, wiring lines and electrodes, not only conductor layers (first conductor layers) just below the active components but also second conductor layers are formed and located on a second side (back side) of the semiconductor substrate so as to respectively face the passive components, wiring lines and electrodes formed on a first side (top side) thereof. More preferably, additional second conductor layers are formed on the back side of the semiconductor substrate so that the second layers are distributed at equal intervals. By forming the first and second conductor layers, it is possible to retain a fixed satisfactory space between the semiconductor substrate and the module substrate.

Another aspect of the present invention facilitates miniaturization. Miniaturization can be attained since passive components can be formed in opening-free places on the back side of the semiconductor substrate and openings are formed not only below electrodes but also below active components. Specifically, more electrical members can be integrated in the fixed area of the semiconductor substrate since the present invention allows passive components such as capacitors and inductors to be integrated on the back side of the semiconductor substrate. That is, the present invention allows various mechanical members to be placed three-dimensionally by using both sides of the semiconductor substrate.

Another aspect of the present invention attains improvement in thermal stability. In a semiconductor device having active components, passive components, wiring lines and electrodes, openings filled with conductor layers (first conductor layers) are formed just below active components or heat generators. That is, an opening formed just below each active component is filled with a conductor layer. Since this conductor layer serves as a thermal radiation passage to lower the thermal resistance, it is possible to prevent the thermal runaway of the active component.

Based on the drawings, the following will provide a detailed description of specific modes for carrying out the present invention, namely, semiconductor devices and manufacturing and packaging methods thereof in accordance with the present invention. Note that each of what are functionally identical to the corresponding ones is given the same reference numeral in all the drawings provided to explain the embodiments and its description is not repeated.

Embodiment 1

Figure 2:
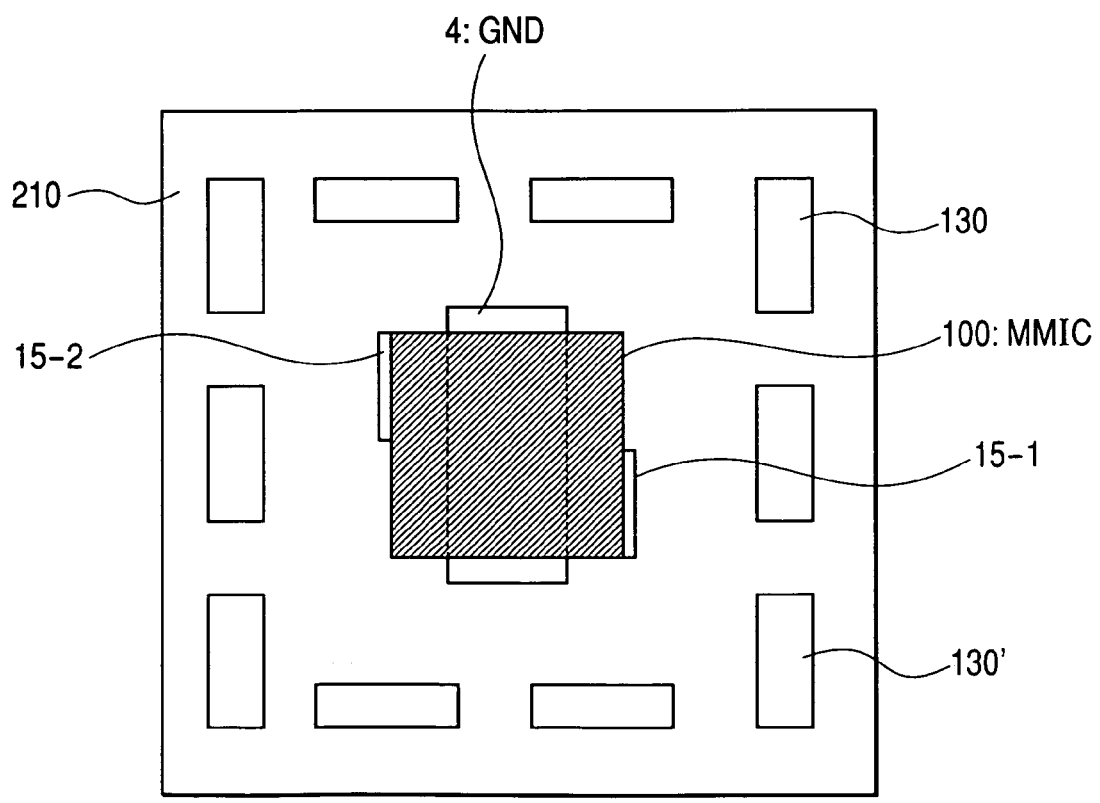
FIG. 2 is a top view of a semiconductor module embodiment of the present invention.
Figure 3:
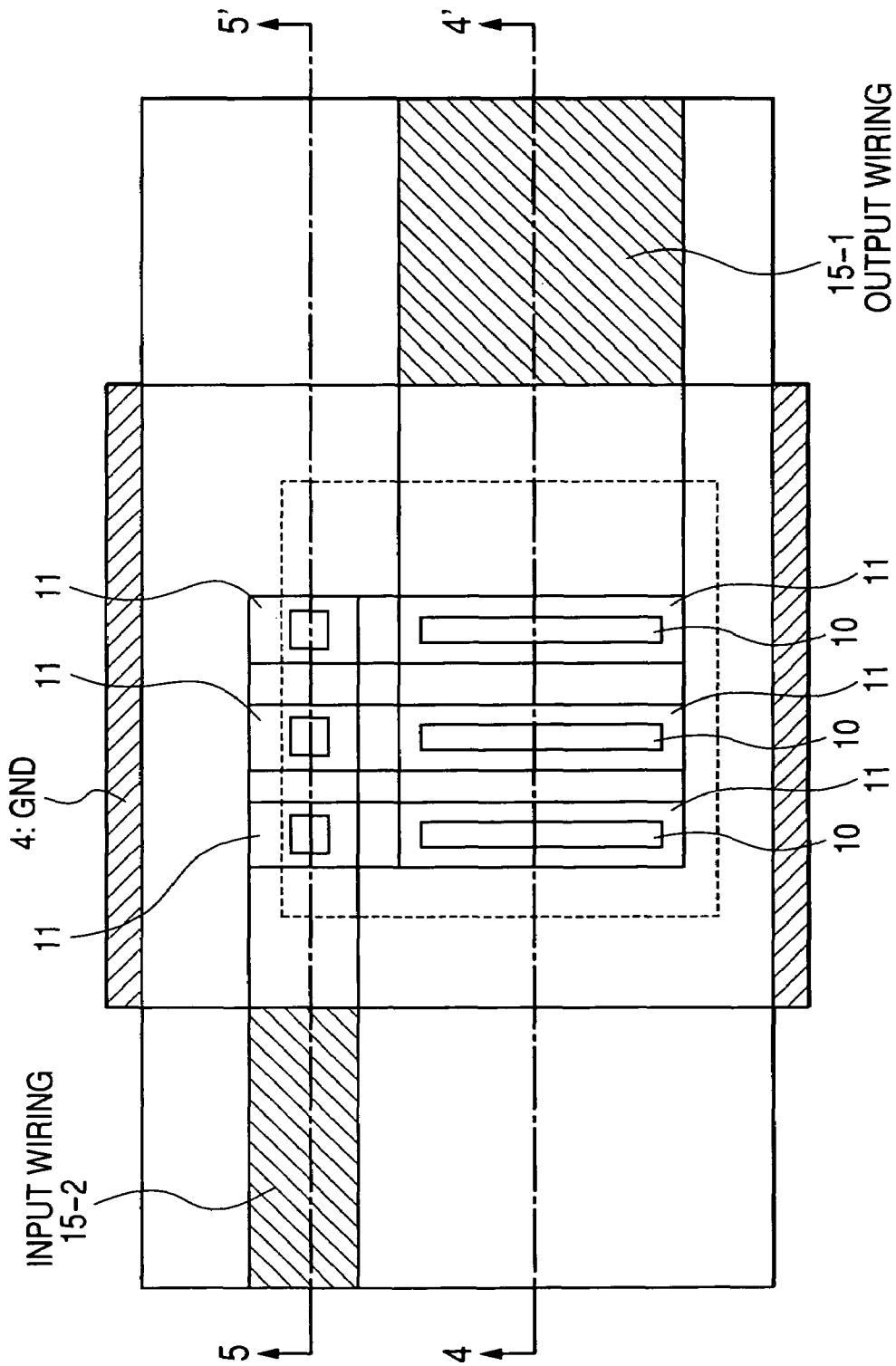
FIG. 3 is a top view of a MMIC and its vicinity in the semiconductor module shown in FIG. 2.
Figure 4:
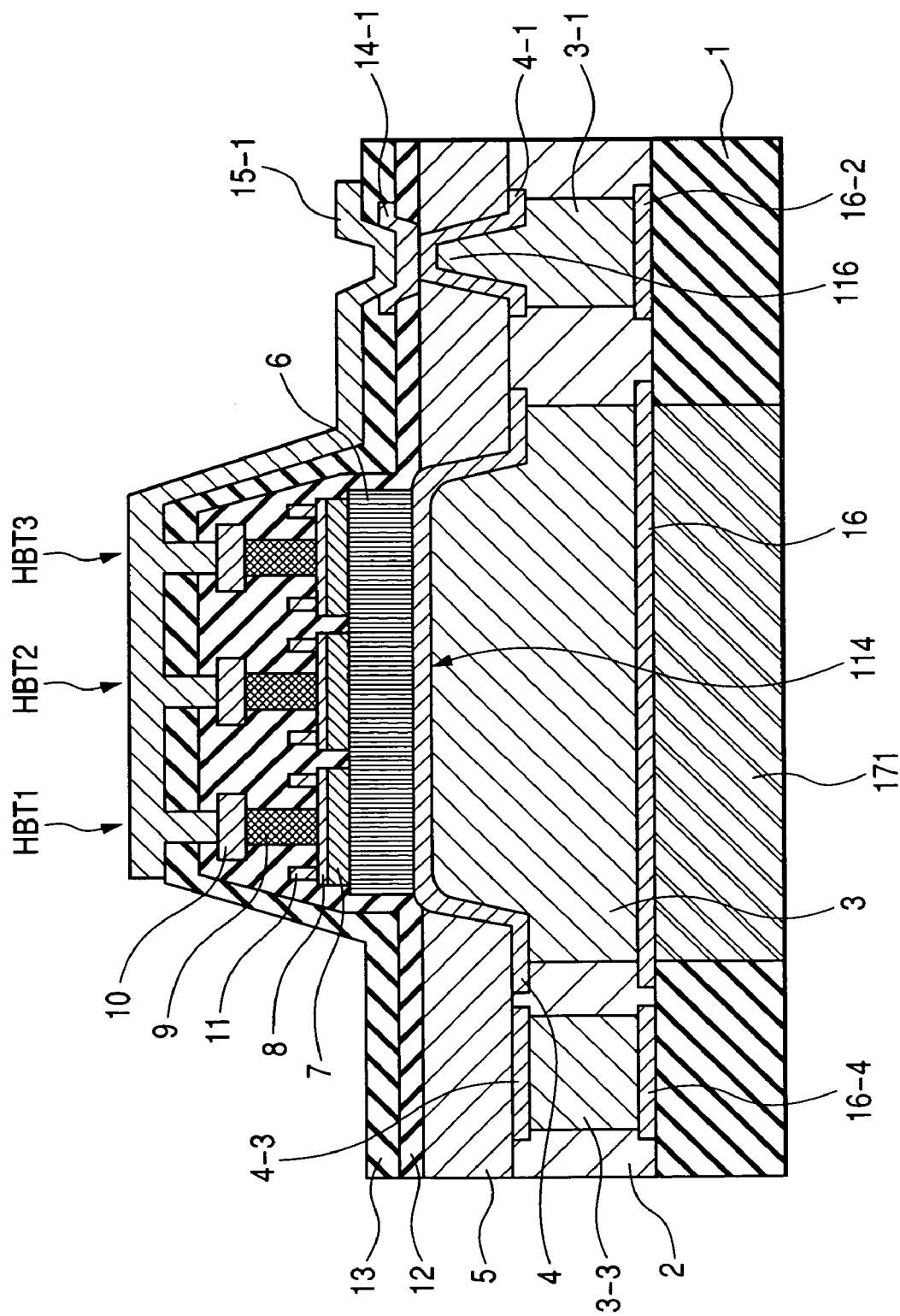
FIG. 4 is its cross-sectional view taken along line 44' shown in the top view of FIG. 3.
Figure 5:
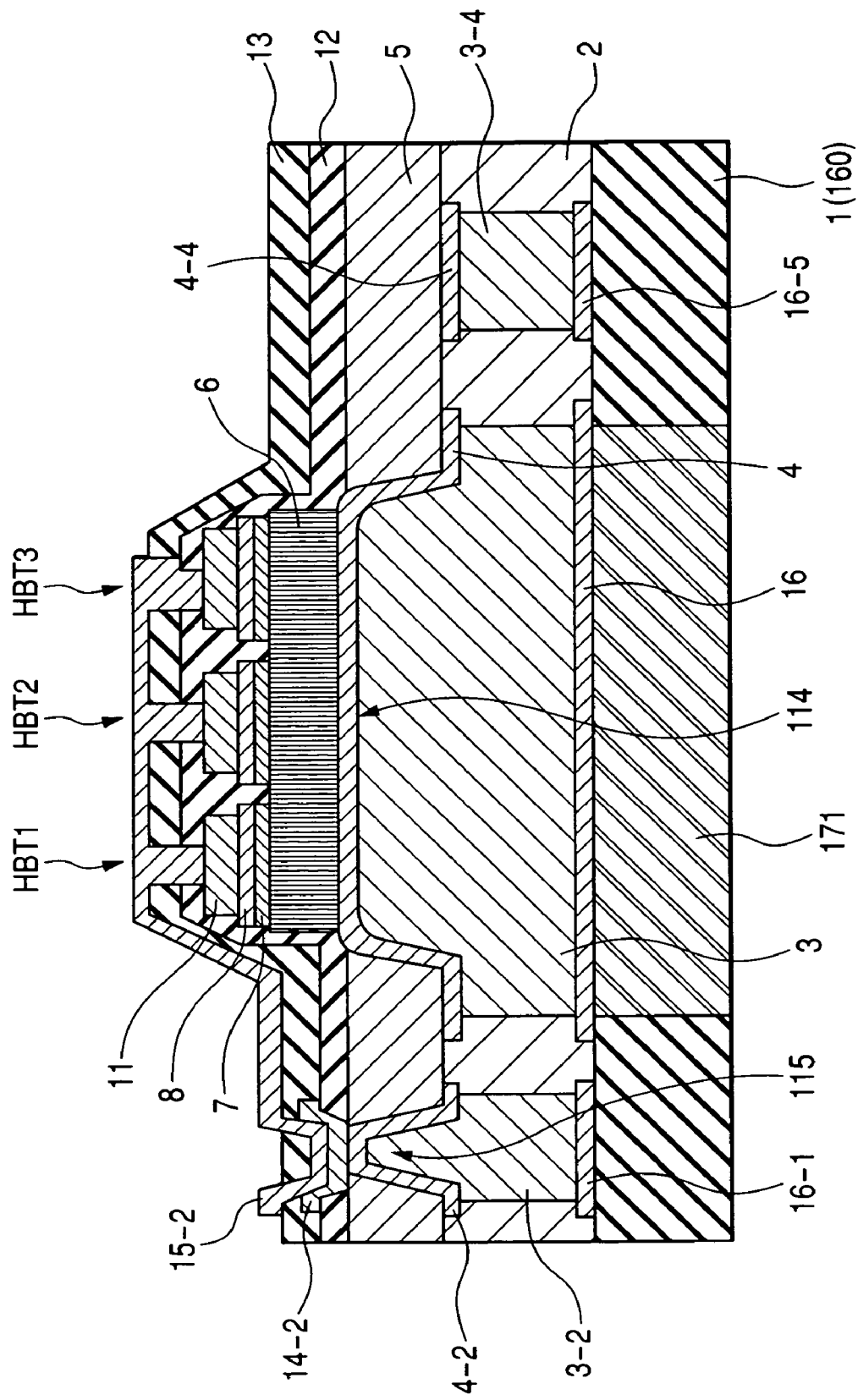
FIG. 5 is its cross-sectional view taken along line 55' shown in the top view of FIG. 3.
Figure 6:
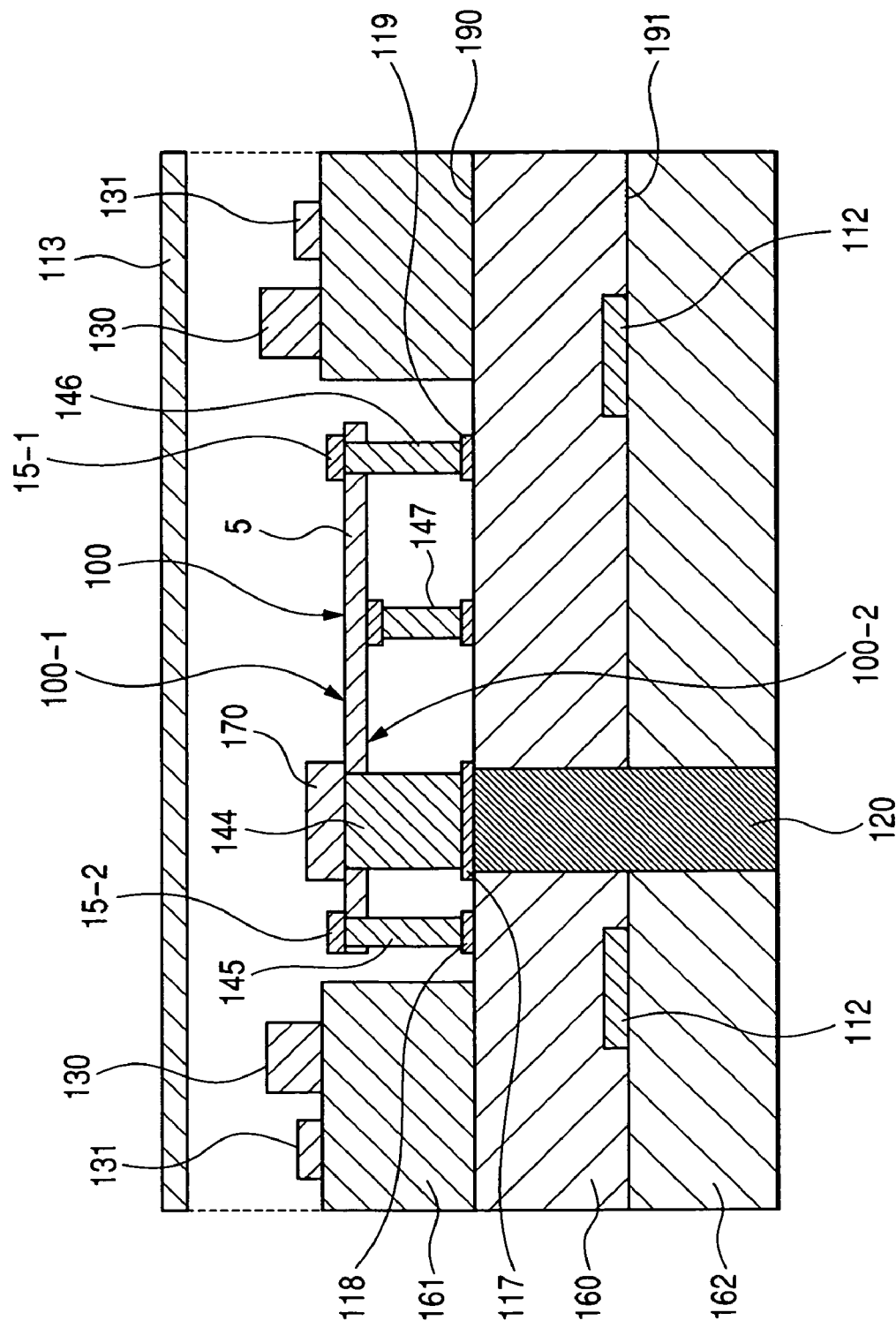
FIG. 6 is a cross-sectional view of a semiconductor module embodiment of the present invention.

The present example is a power amplifier module. FIG. 2 is a general plan view of the present example. FIG. 3 is an enlarged top view of a MMIC (100) and its vicinity. FIGS. 4 and 5 show longitudinal cross-sectional views of this MMIC used in the present power amplifier module. These longitudinal cross-sectional views respectively correspond to lines 55' and 44' in FIG. 3 FIG. 6 is a schematic cross-sectional view of the present power amplifier module embodiment. FIG. 6 schematically shows the mutual relations of individual members stacked in the module. Note that a collector up HBT is used in the present MMIC embodiment.

As indicated by the module layout of FIG. 2, the MMIC (100) is mounted on a module substrate 210 and other chip members 130 and 130' which are, for example, passive components are located around it. Note that the other rectangles, shown around the MMIC (100) and chip members 130 and 130' in FIG. 2, are also chip devices required in this module although they are not given particular reference numerals. Reference numerals 15-2, 15-1 and 4 respectively refer to the input, output and ground of the MMIC (100). The plan view of FIG. 1 shows the basic arrangement of main members on the module substrate.

FIG. 3 is an enlarged plan view of the MMIC (100) and its vicinity in the power amplifier module. Reference numerals 15-2, 15-1 and 4 in FIG. 3 respectively refer to the same input wiring line, output wiring line and ground (GND) as in FIG. 2. Note that the respective parts of the transistor are shown in FIG. 3 although they exist below the wiring lines. Reference numeral 10 refers to a collector electrode while numeral 11 refers to a base electrode. In this example, three base electrodes 11 are all connected to the input wiring line 15-2. Likewise, three collector electrodes 10 are all connected to the output wiring line 15-1. The cross sections of FIGS. 4 and 5 are depicted respectively along lines 55' and 44' in FIG. 3. They will be described later in detail.

FIG. 6 shows the laminated structure of the module. In this example, the module substrate is composed of three substrate layers 161, 160 and 162. In the layout of FIG. 2, these three substrate layers are shown collectively as the module substrate 210. Usually, the module substrate uses low-temperature cofired glass ceramics with relative permeability 8. It is also possible to use a resin substrate as the module substrate.

As understood from the layout of FIG. 2, the MMIC (100) is located at or near the center of the module substrate and, around it, passive devices, transmission lines 131 and other various electrical members 130 and 130' are located. The detailed structure of the MMIC itself is shown in FIGS. 4 and 5 although not shown in this figure. Proceed to FIG. 6. As mentioned earlier, this figure schematically shows the mutual relations of various members stacked in the module. In this example where a three-layered substrate is used, the MMIC is mounted on the substrate layer 160, individual electrical members 130 and transmission lines 131 are provided on the substrate layer 161. Note that reference numeral 100-1 refers to a first side (hereinafter, denoted simply as the top side) of the semiconductor substrate 5 while numeral 100-2 refers to a second side (hereinafter, denoted simply as the back side) thereof. Where an active component 170 is formed, an opening is formed on the back side of the semiconductor substrate 5. This opening is filled to form a conductor layer (denoted as the first conductor layer in this specification) 144. The internal detailed structures of barrier metal layers and others are not shown in this schematic diagram. The first conductor layer 144 is brought out to a wiring line 117 provided on the top side of the substrate layer 160. Usually, this kind of conductor layer is called a bump and, if serves as an electrode, called a bump electrode. The base electrode side of the HBT is indicated by reference numeral 15-2 (input wiring line). Likewise, the collector electrode side is indicated by reference numeral 15-1 (output wiring line). By their associated openings and conductor layers (denoted as second conductor layers in this specification) filled therein, these input and output wiring lines 15-1 and 15-2 are brought out to wiring lines 118 and 119 formed on the top side of the substrate layer 160. In this example, an opening is also formed through the substrate layers 160 and 162 and filled with an electrode layer 171. This facilitates heat dissipation via the electrode layer 171. This kind of opening is called a thermal via. Needless to say, this thermal via may be omitted depending on what are required in characteristics and the like by the equipment where the module is to be used.

Note that in FIG. 6, reference numeral 112 refers to a bias line provided in the module substrate and numeral 170 refers to an active component (Tr) formed on the semiconductor substrate. In addition, numerals 190 and 191 refer to ground planes, 120 is a thermal via, 112 is a bias line and 113 is a metal cap.

Figure 26:
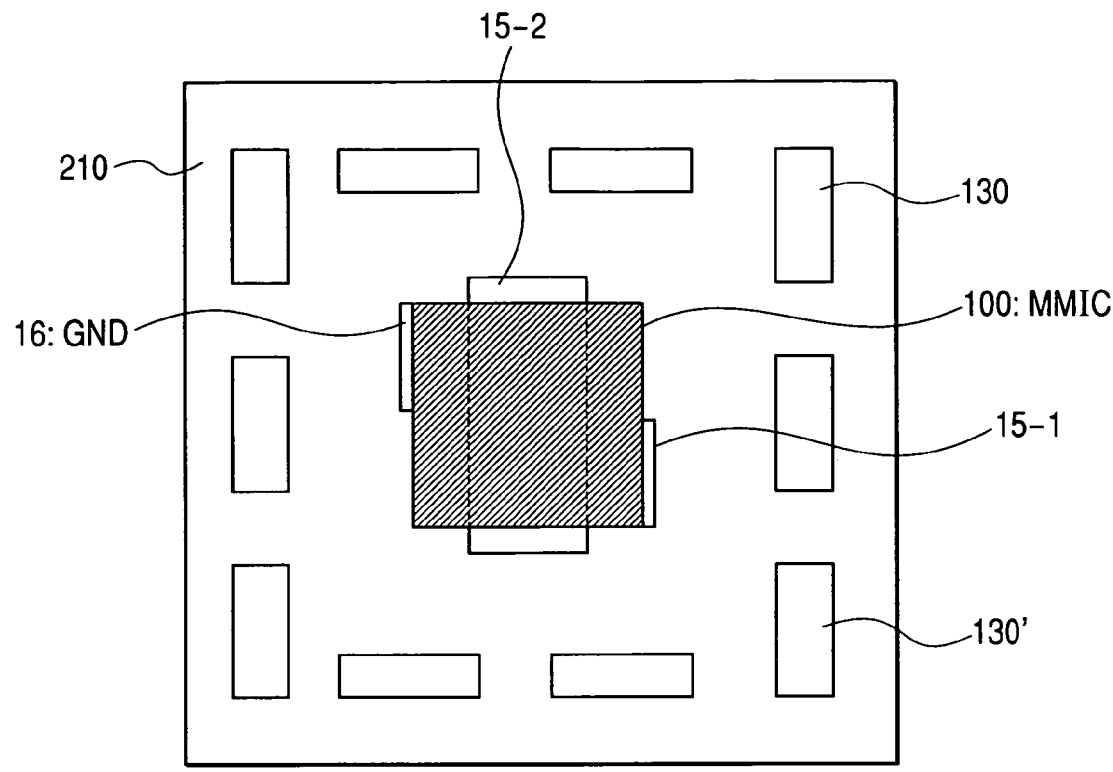
FIG. 26 shows the general layout of a module substrate on which an emitter top HBT is mounted.

Although the example described so far has a collector up HBT, it is also possible to use an emitter up HBT. Shown in FIG. 26 is a top view of a module substrate on which an emitter top HBT is mounted. Basically, the emitter up HBT-MMIC has the same cross section as the collector up HBT-MMIC except for the differences due to the reversed vertical positions of the collector and emitter. As well, the layout of FIG. 26 is the same as that of FIG. 2 except that each terminal has a different role. The portion indicated by reference numeral 15-1 is connected to the base terminal and wired from the top side to the back side by a through via. The portion indicated by reference numeral 15-2 is a power stage output pad which is connected to the collector terminal (by a via just under the transistor). Reference numeral 16 indicates the ground which is connected to the emitter terminal and wired from the top side to the back side by a through via. Since grounded emitter operation is assumed, the emitter is grounded at the module substrate.

Then, the following provides a detailed description of the MMIC portion. In this example, the MMIC is mounted face up. That is, as shown in FIG. 6, the first side (denoted simply as the top side) 100-1 of the semiconductor substrate 5 is faced upward and an emitter wiring region, a base wiring region and a collector wiring region are provided on the top side of the MMIC. Reference numeral 100-2 indicates the back side of the semiconductor substrate 5. FIGS. 4 and 5 show cross sections of this MMIC which has a collector top HBT. The semiconductor substrate 5 of the MMIC (100) is mounted on the module substrate 1 (corresponding to the substrate layer 160 shown in FIG. 6) by a via filled with the conductor layer 3. The lead conductor layer of the collector electrode appears in the cross section of FIG. 4 while the lead conductor layer of the base electrode appears in FIG. 5.

The HBT formed on the semiconductor substrate 5 is described below in detail. In this example, three HBTs (HBT1, HBT2 and HBT3) are connected in parallel. On a sub-emitter layer 6 formed on the semiconductor substrate 5, emitter layers 7, base layers 8 and collector layers 9 are formed. While the sub-emitter layer 6 is connected to a back side electrode 4, the three collector electrodes 10 are joined together and connected to the wiring line 15-1 (FIG. 4). The wiring line 15-1 for the collector side is connected to a pad 14-1 and further to a back side electrode 4-1.

Likewise, the three base electrodes 11 are joined together and connected to the wiring line 15-2 as shown in FIG. 5. In addition, the wiring line 15-2 for the base side is connected to a back side electrode 4-2 by way of a pad 14-2. The active region of the HBT is covered by an interlayer dielectric layer 12. This interlayer dielectric layer 12 is locally opened to form the pads 14-1 and 14-2. An interlayer dielectric layer 13 is formed to cover at least these pads 14-1 and 14-2. The interlayer dielectric layer 13 is opened at least where the pads 14-1 and 14-2 are formed. Wiring lines are formed on the interlayer dielectric layer 13 so that the wring lines 15-1 and 15-2 are respectively connected to the pads 14-1 and 14-2 through their openings.

In the present example, an emitter via hole 114 is formed on the back side of the MMIC so as to face the HBT of the MMIC. Meanwhile, a base via hole 115 and a collector via hole 116', which are also formed on the back side of the MMIC, are located so as not to face the HBT. Note that these via holes are filled with the first conductor layer 114 and the second conductor layers 115 and 116, respectively. These first and second conductor layers are made so high as to exceed the thickness of the semiconductor substrate 5.

In FIGS. 4 and 5, the base via hole 115 and the collector via hole 116 are formed so as reach the WSiN electrodes 14-1 and 14-2 on the top side of the GaAs substrate 1. Therefore, these via holes are equal in depth to the emitter via hole 114 formed just below the active region of the HBT. This is very effective to lower the cost since the plural via holes can be formed at a time.

In FIGS. 4 and 5, conductor layer 3-2 is also formed in addition to the conductor layers which fill the emitter via hole 114 and the collector via hole 116. The conductor layer 3-3 and 3-4 are what are called second conductor layers in this specification. They attain an effect to raise the packaging reliability by securing the mechanical strength.

Figure 7:
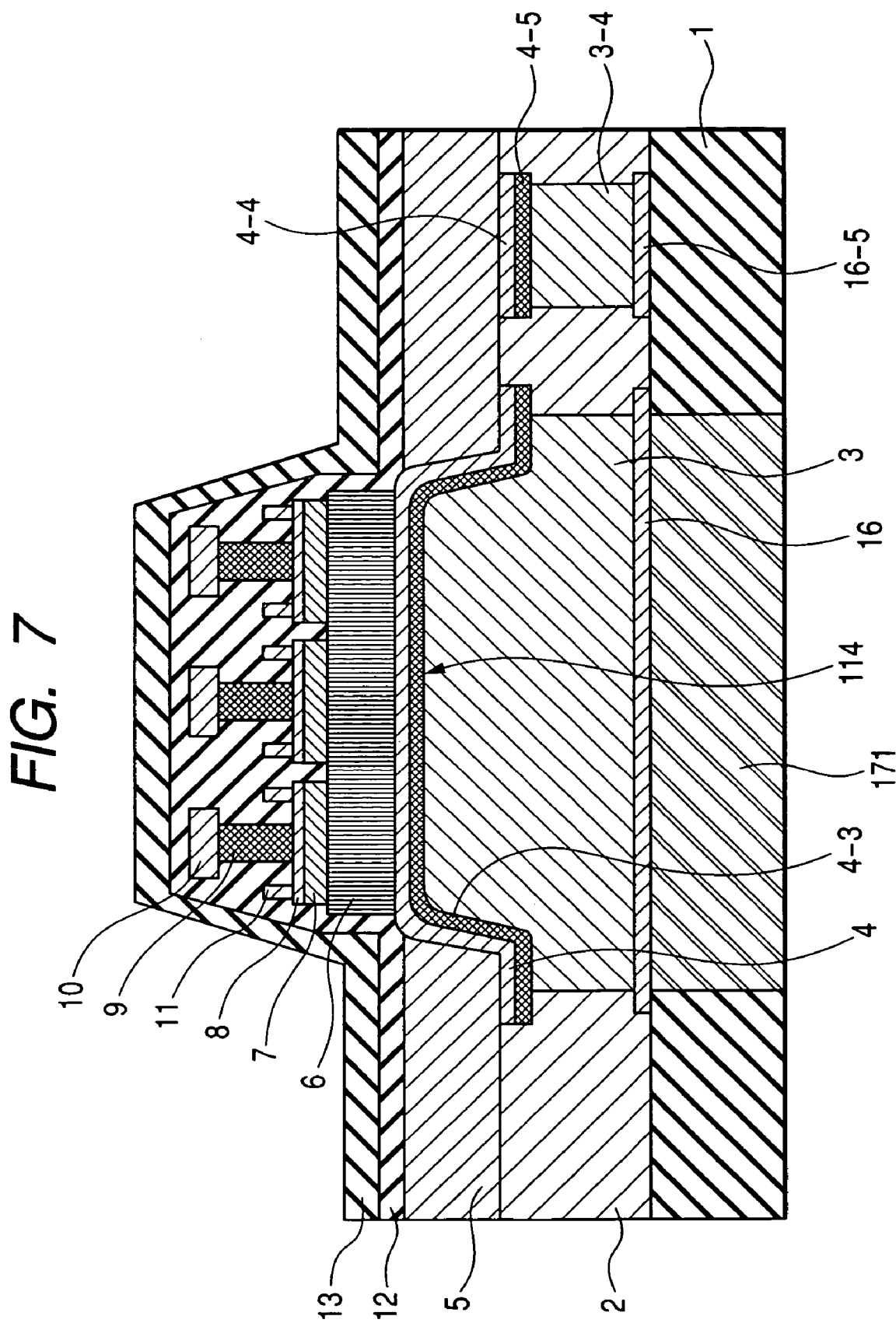
FIG. 7 is a longitudinal cross-sectional view of a collector top HBT in another semiconductor device embodiment of the present invention.

In the example of FIG. 7, a barrier metal is formed. In this example, after a back side electrode 4 is formed in an emitter via hole 114, an electrode 4-3 is additionally formed before a conductor layer 3 is formed. The electrode 4-3 acts as a barrier metal for the conductor layer 3. Specifically, for example, the back side electrode 4 is a multi-layered Au/Ge/Ni/Ti/Au electrode, the electrode 4-3 is made of Ni or Cr and the conductor layer 3 is made of Au or Cu. Description of the other portions is omitted since they are same as in FIG. 1.

Figure 8:
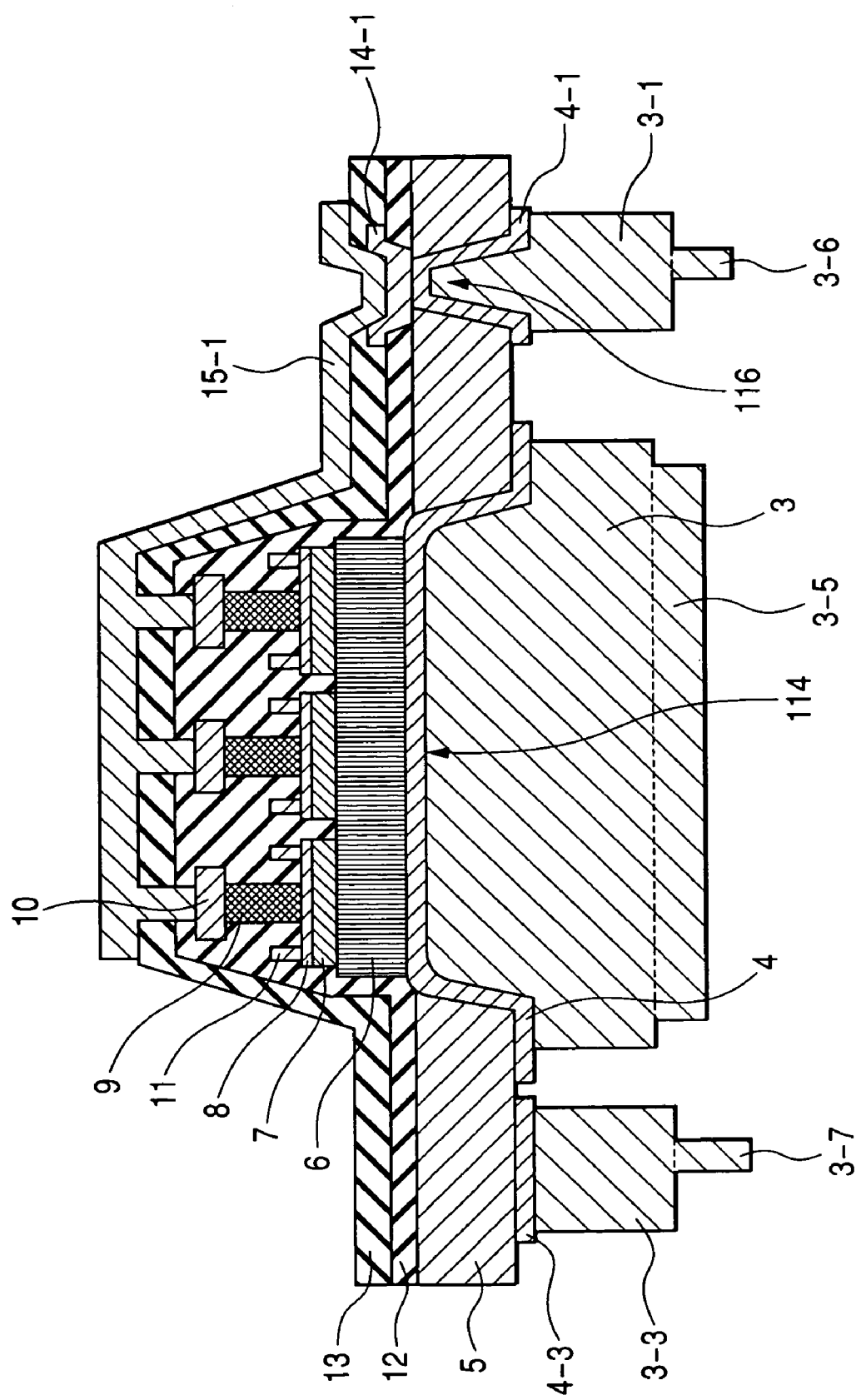
FIG. 8 is a longitudinal cross-sectional view of a collector top HBT in another semiconductor device embodiment of the present invention wherein the bumps have narrowed tips.
Figure 9:
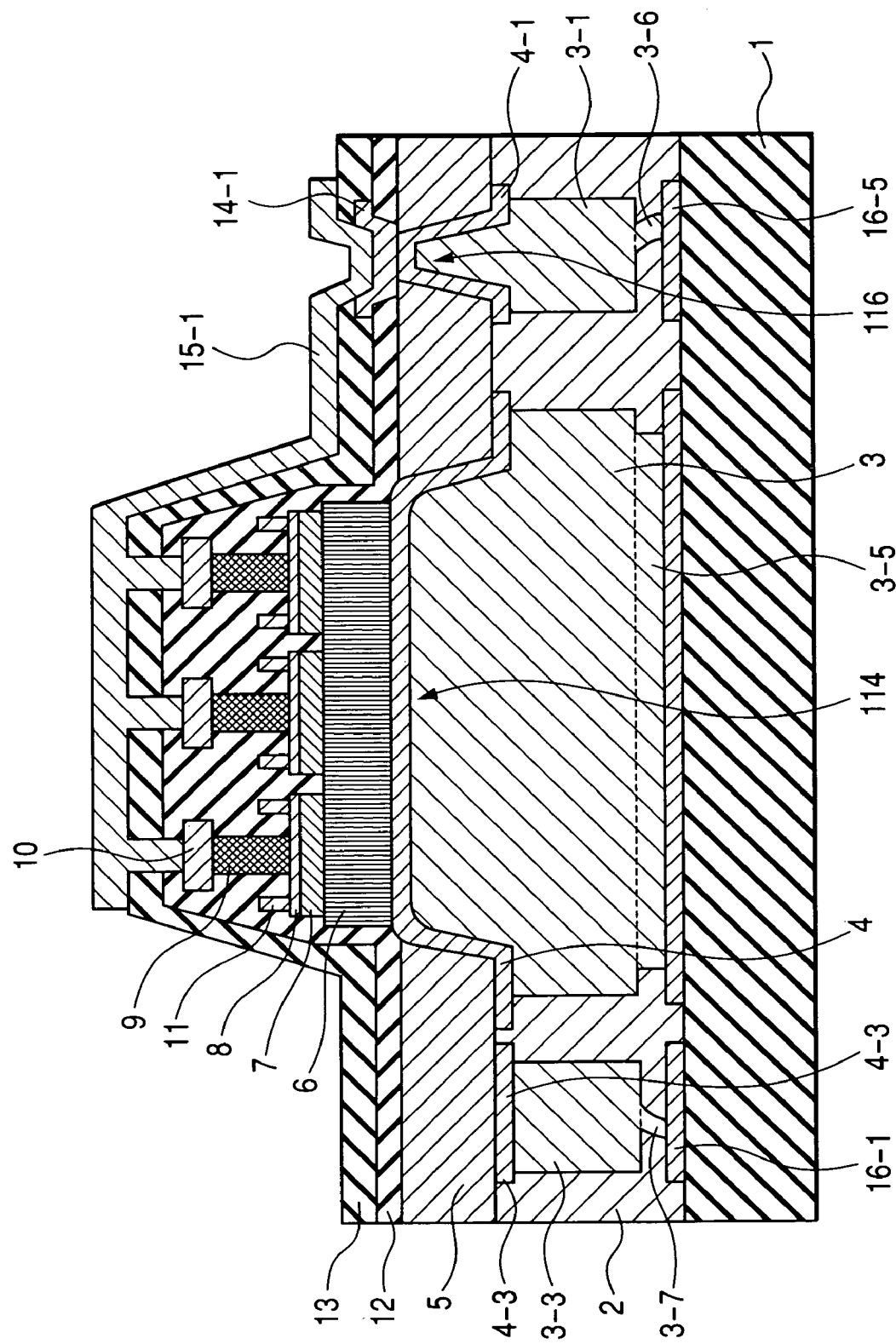
FIG. 9 is an enlarged cross-sectional view showing how the HBT of FIG. 8 is mounted on the module substrate.

Then, the following explains that the first and second conductor layers of the present invention can satisfactorily cope with the unevenness of the module substrate. In the example of FIG. 8, conductor layers 3 and 3-1 are formed as mentioned earlier after via hole back side electrodes 4 and 4-1 are formed in the emitter via hole 114 and collector via hole 116. In this example, however, the conductor layers of the emitter via hole and collector via hole have tips narrowed. The bump 3-3 formed via the electrode layer 4-2 has a narrowed tip 3-7, too. Since the narrowed tips 3-5, 3-6 and 3-7 can easily be adjusted in length, the height of each conductor layer filled in the corresponding opening from the back side of the semiconductor substrate can easily be corrected. Preferably, the narrowed tip is about, for example, 25 microns in length. Preferably, the height adjustment is made when the semiconductor substrate 5 is attached to the substrate layer 160. Usually, the width of the narrowed tip is set to about 10 microns by considering the warp of the module substrate. FIG. 9 is a cross-sectional view of a module where the height of each conductor layer from the back side is easily corrected. When the semiconductor substrate 5 is mounted on the module substrate 1, the heights of conductor layers 3-5 and 3-6 are corrected. That is, the lengths of the narrowed tips 3-6 and 3-7 are adjusted in accordance with the narrowed tip 3-5 which does not bend. The other portions are same as those in FIG. 8.

Figure 10:
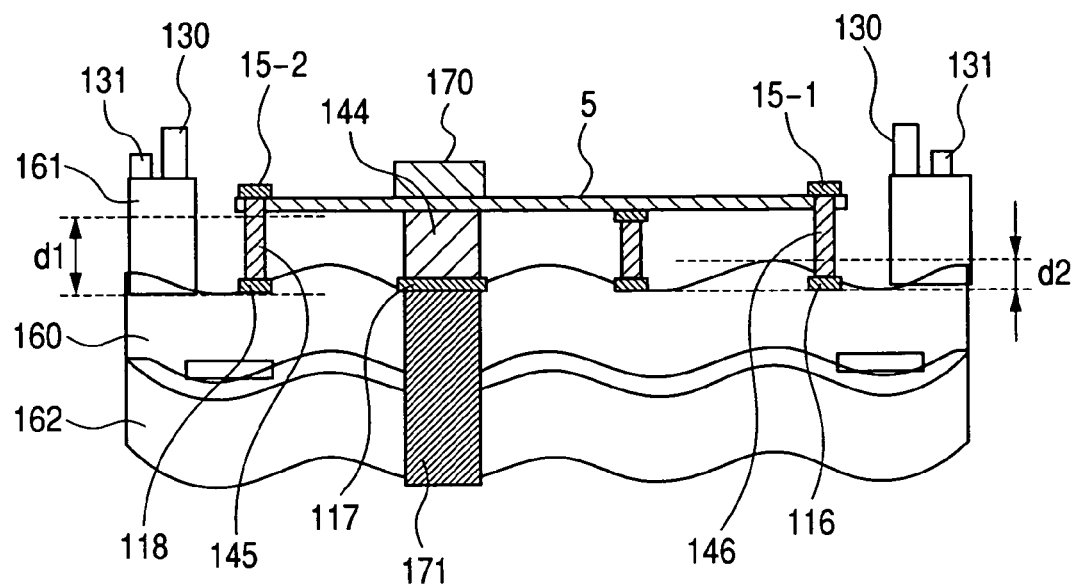
FIG. 10 is a cross-sectional view of a semiconductor module showing irregularities of the module substrate.

Thus, the semiconductor substrate 5 can easily be mounted without losing the levelness substantially at all by adjusting the height of each conductor layer. FIG. 10 is an enlarged schematic diagram which illustrates this situation. Three module substrate layers 162, 160, and 161 are used in the same manner as in FIG. 6. Its laminated structure and layout are also same as in FIG. 6. As such, assume that at least the module substrate layers 162 and 160 have a thickness irregularity of d2. The thickness from the bottom of the MMIC's semiconductor substrate 5 to the concave surface of the substrate layer 160 is d1. Usually, d1 is set to between 20 microns and 100 microns while d2 is about 10 microns at most. Therefore, it is easy to make the semiconductor substrate substantially not subject to the influence of stress and others due to the unevenness of the module substrate if the conductor layers are structured as mentioned above.

Figure 11:
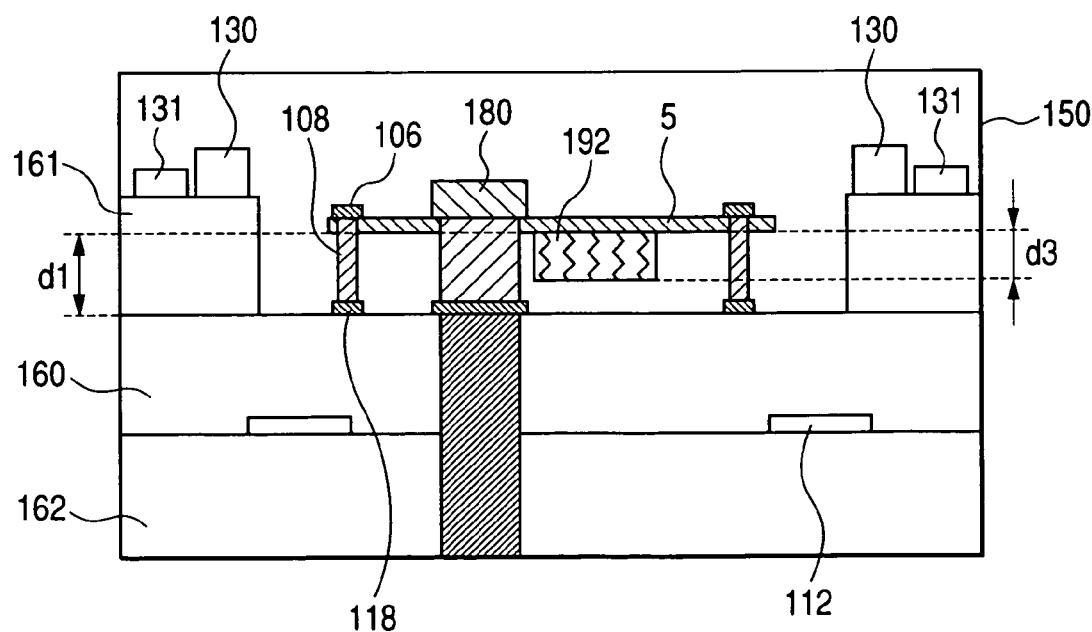
FIG. 11 is a cross-sectional view of a semiconductor module embodiment of the present invention in which an electrical member is integrated on the back side of the semiconductor substrate.
Figure 12:
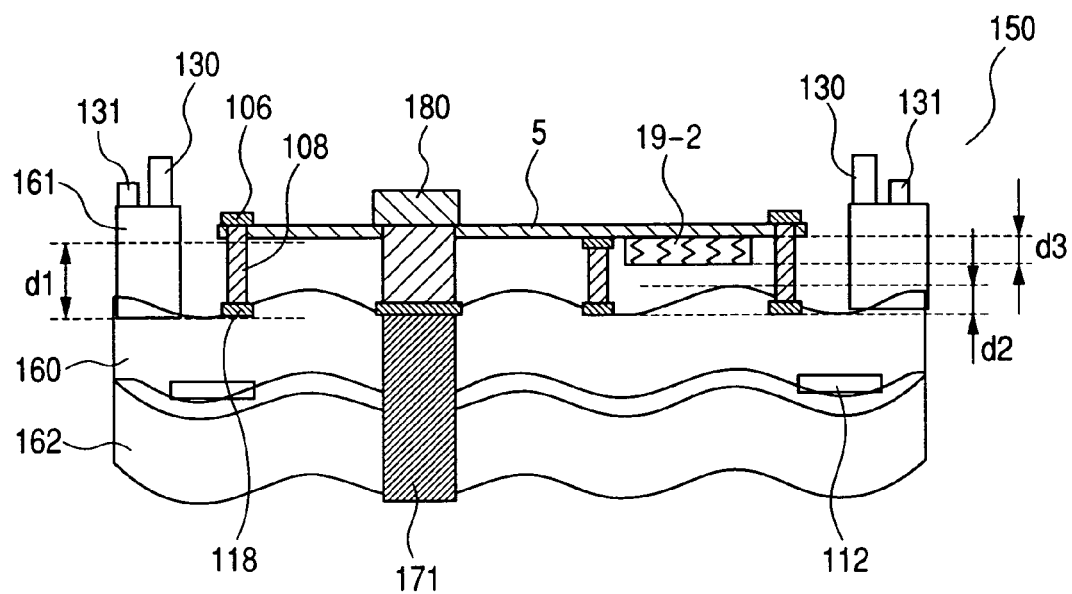
FIG. 12 is a cross-sectional view of the semiconductor module of FIG. 11 wherein irregularities of the semiconductor substrate are depicted.

FIG. 11 is a cross sectional view of a module in which each side of the semiconductor substrate 1 has an electrical member or semiconductor device provided thereon. A semiconductor active component 180 is formed on the top side of the semiconductor substrate 1 while a semiconductor device 192 such as a passive device is formed on the back side. d1 is the distance from the back side of the semiconductor substrate 5 to the surface of the module substrate layer 160. d3 is the thickness of the electrical member 192 formed on the back side of the semiconductor substrate 5. This cross sectional view is depicted again in FIG. 12 by taking into consideration the unevenness of the module substrate layers 160 and 162. In this case, d1, d2 and d3 are required to meet the relation d1 d2+d3 wherein d1 is the distance from the back side of the semiconductor substrate 5 to the concave surface of the module substrate layer 160, d2 is the height irregularity of the module substrate and d3 is the thickness of the electrical member 192. If the conductor layers are structured as mentioned above, this relation can also be met, that is, the semiconductor substrate 5 can satisfactorily be attached to the module substrate layer 160.

Figure 27:
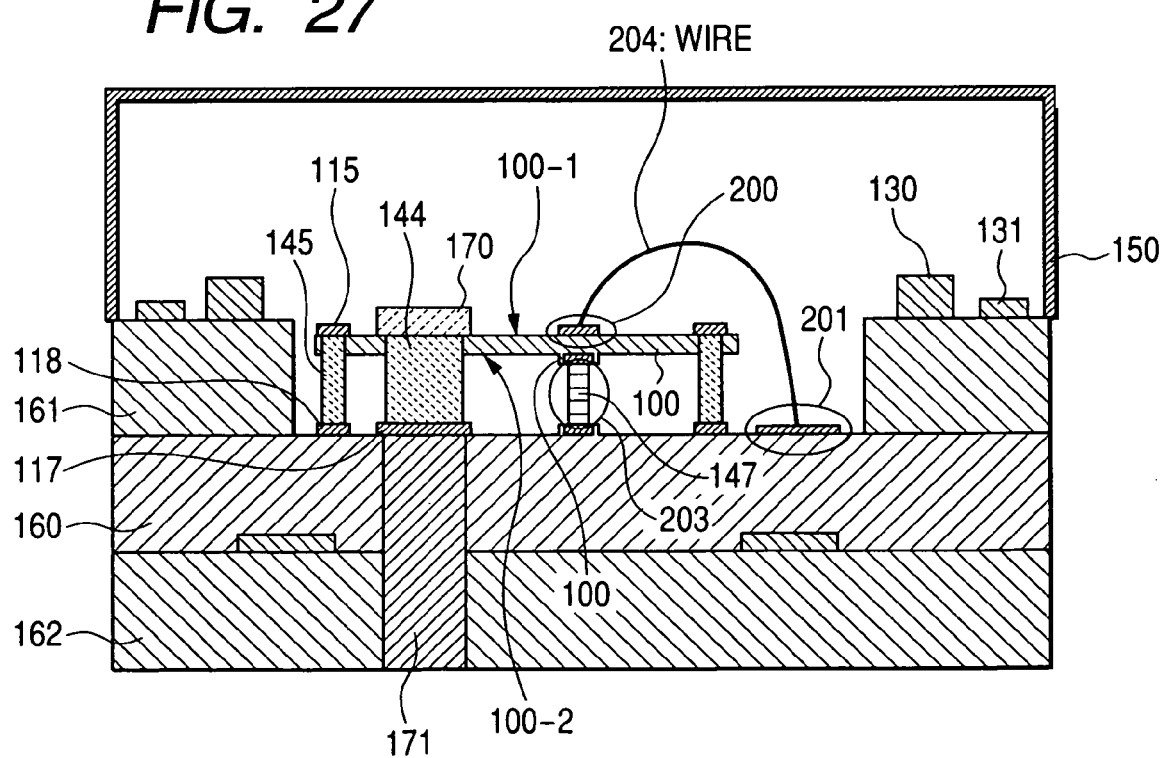
FIG. 27 is a schematic cross-sectional view of an embodiment where both face up bump bonding and wire bonding are used.

Note that it is also possible to use both face up bump bonding and wire bonding when a module is assembled. This case is shown by the cross sectional view of FIG. 27. Namely, an MMIC is mounted face up while a bonding wire is also used for electrical connection to the module substrate. This basic structure is same as that shown in FIG. 6 except that wire bonding is used in addition to bump bonding. Specifically, reference numeral 200 refers to a bonding pad electrode on the MMIC. Numeral 201 refers to an bonding pad electrode on the module substrate. Numeral 204 refers to a wire. In this example, a free bump 147 is also provided just below the wire bonding pad in order to reinforce the mechanical strength of the wire bonding. Description of the other portions is omitted since they are identical to those in FIG. 6. Further, needless to say, the structure of this example can be modified so as to use both bump bonding and wire bonding according to the specific structure of a different MMIC.

Embodiment 2

The following describes a typical method of manufacturing a semiconductor device. FIGS. 13 to 20 are cross sectional views of a device to explain how the semiconductor device is manufactured in accordance with the present invention. This example manufactures a high power multi-fingered HBT composed of basic HBTs which are connected in parallel.

Firstly, a highly doped n-type GaAs sub-emitter layer (Si concentration $5 \times 10^{18}$ cm$^{-3}$, thickness 0.8 μm) 6, a n-type InGaP emitter layer (InP molar ratio 0.5, Si concentration $5 \times 10^{17}$ cm$^{-3}$, thickness 0.2 μm) 7, a p-type GaAs base layer (C concentration $3\times10^{19}$ cm$^{-3}$, thickness 70 nm) 8 and a n-type InGaAs collector layer (Si doped, thickness 0.8 µm) 9 are grown on a semi-insulation GaAs substrate 5 by metalorganic vapor phase epitaxy. In the InGaAs collector layer, the InAs molar ratio varies from 0 to 0.5 and the Si concentration varies from $3\times10^{16}$ cm$^{-3}$ to $2\times10^{19}$ cm$^{-3}$.

Figure 13:
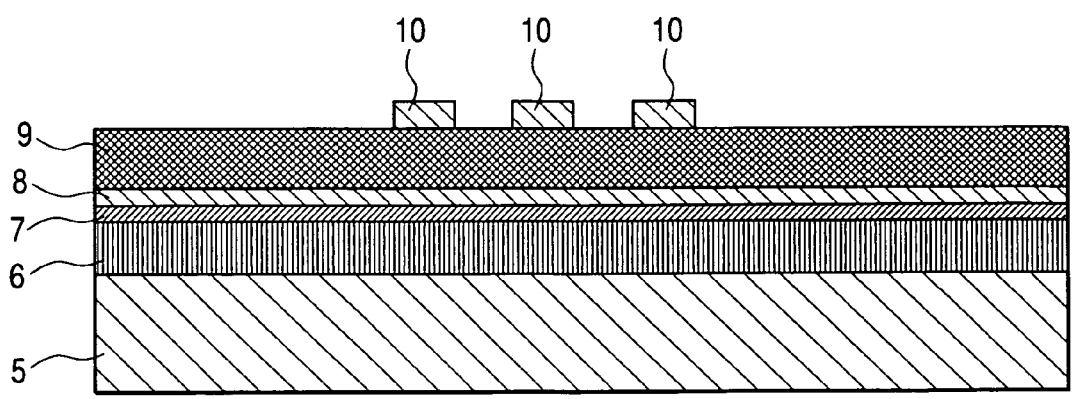
FIG. 13 is a cross-sectional view to show a sequence of steps performed to manufacture a collector top HBT-integrated semiconductor substrate according to the present invention.

Then, after a WSi layer (WSi: Si molar ratio 0.3, thickness 0.3 µm) is deposited on the whole wafer surface by RF sputtering, the WSi layer is processed into a desired pattern to form collector electrodes 10 by photolithography and CF$_4$-used dry etching (FIG. 13).

Then, using the collector electrodes 10 as mask regions, the n-type InGaAs collector layer 9 is processed into a desired pattern by dry etching with SF$_6$ and SiCl$_4$ and wet etching with a mixture of phosphoric acid, hydrogen peroxide and water.

Figure 14:
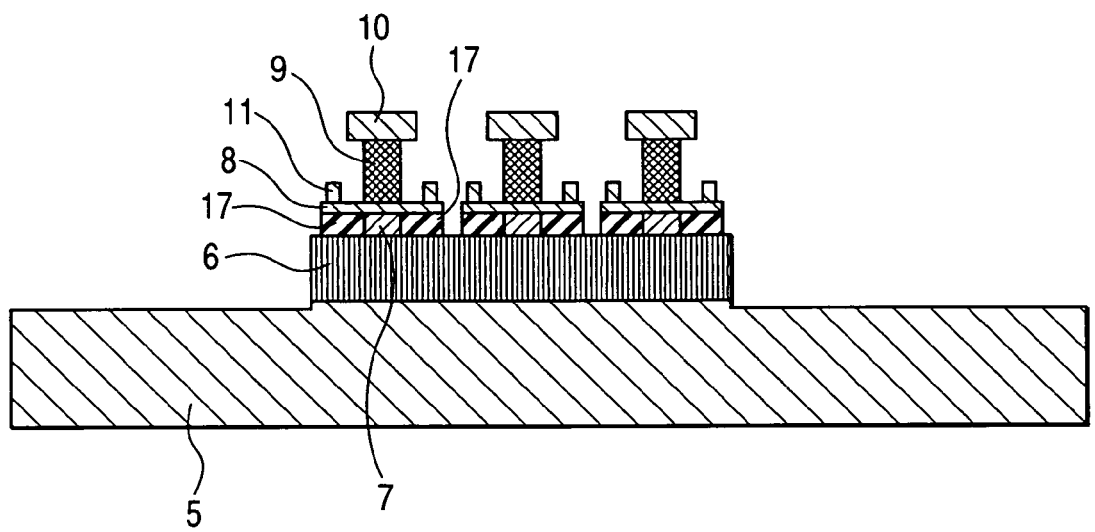
FIG. 14 is a cross-sectional view to show the sequence of steps performed to manufacture the collector top HBT-integrated semiconductor substrate according to the present invention.

To the subsequent procedure to fabricate a collector top HBT, a widely known method can satisfactorily be applied. FIG. 14 is a cross sectional view of the active region of the HBT. This procedure is briefly described below. Arsenic ions are implanted into the whole surface at a dose of $2\times10^{12}$ cm$^{-2}$ with an acceleration energy of 50 KeV at room temperature to form a high resistance InGaP region (not shown in the figure) in each parasitic transistor region 17 (around the proper transistor region right below the collector electrode 10) in order to suppress the base current flowing through the parasitic emitter-base junction. To prevent complexity, the high resistance regions 17 are omitted in the description/illustration of any HBT shown in this specification since the high resistance regions 17 do not constitute the substantial part of the present invention.

Then, base electrodes (Pt (thickness 20 nm)/Ti (thickness 50 nm)/Pt (thickness 50 nm)/Au (thickness 200 nm) stacked) 11 are formed by electron beam vapor deposition and liftoff processing.

Then, the p-type GaAs base layer 8, the InGaP emitter layer 7 and the GaAs sub-emitter layer 6 are removed to expose the semi-insulation GaAs substrate 5 by ordinary photolithography and wet etching with a hydrochloric acid solution and a mixture of phosphoric acid, hydrogen peroxide and water (FIG. 14).

Figure 15:
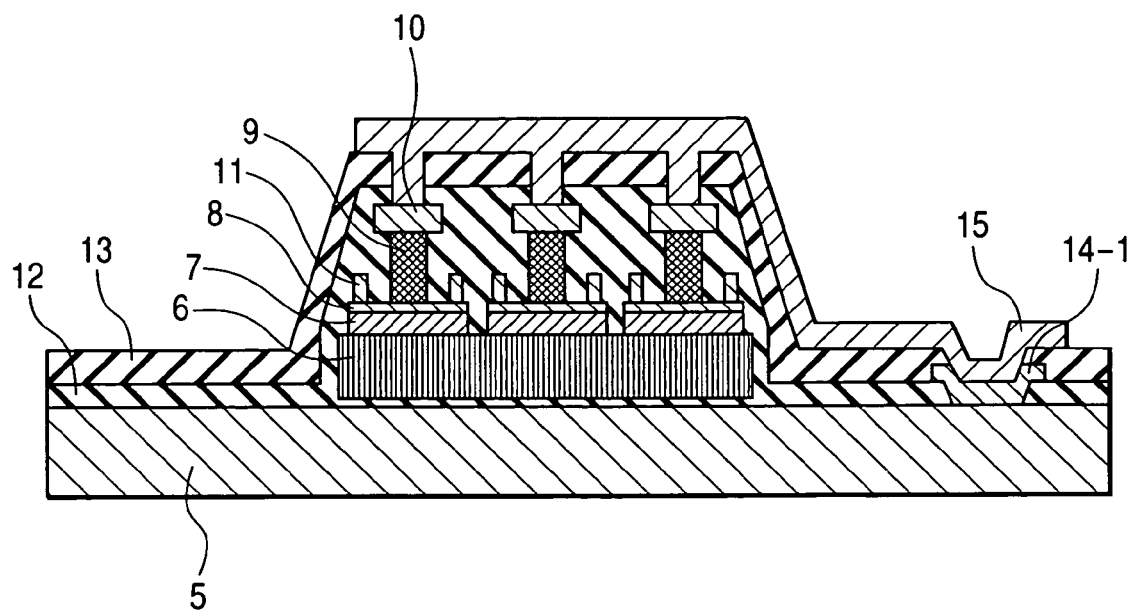
FIG. 15 is a cross-sectional view to show the sequence of steps performed to manufacture the collector top HBT-integrated semiconductor substrate according to the present invention.

Then, a SiO$_2$ layer (thickness 1 µm) 12 is formed as an inter-layer insulation film by plasma activated chemical vapor deposition. This SiO$_2$ layer 12 is removed by ordinary photolithography and dry etching where the base via hole and collector via hole are to be formed. Then, a WSiN layer (thickness 0.3 µm) is deposited on the whole wafer surface by RF sputtering. After this, a top side electrode for the base via hole (not covered by the cross-sectional view) and a top side electrode 14 for the collector via hole are formed by photolithography and CF$_4$-used dry etching (FIG. 15). Note that this top side electrode 14 for the collector via hole is made of the same material as resistor elements and can be fabricated with resistor elements in the MMIC at a time.

Then, an inter-layer insulation SiO$_2$ film (thickness 1 µm) 13 is formed again by plasma-activated chemical vapor phase deposition. The SiO$_2$ film 13 is removed by photolithography and dry etching to form contact holes which respectively allow the base electrodes and collector electrodes to the corresponding wiring lines. Likewise, the SiO$_2$ 13 is removed where the base via hole and collector via hole are to be formed. Then, Mo (thickness 50 nm)/Au (thickness 800 nm) wiring lines 15 are formed respectively for the base and the collector by electron beam vapor deposition and milling. Alternatively, each wiring line 15 may also be formed as a Ti (thickness 50 nm)/Au(thickness 800 nm)-stacked layer by electron beam vaporization and liftoff processing. The wiring line 15 shown in FIG. 15 is connected to the collector electrodes 10 through the contact holes and to the top side electrode 14 for the collector via hole.

Figure 16:
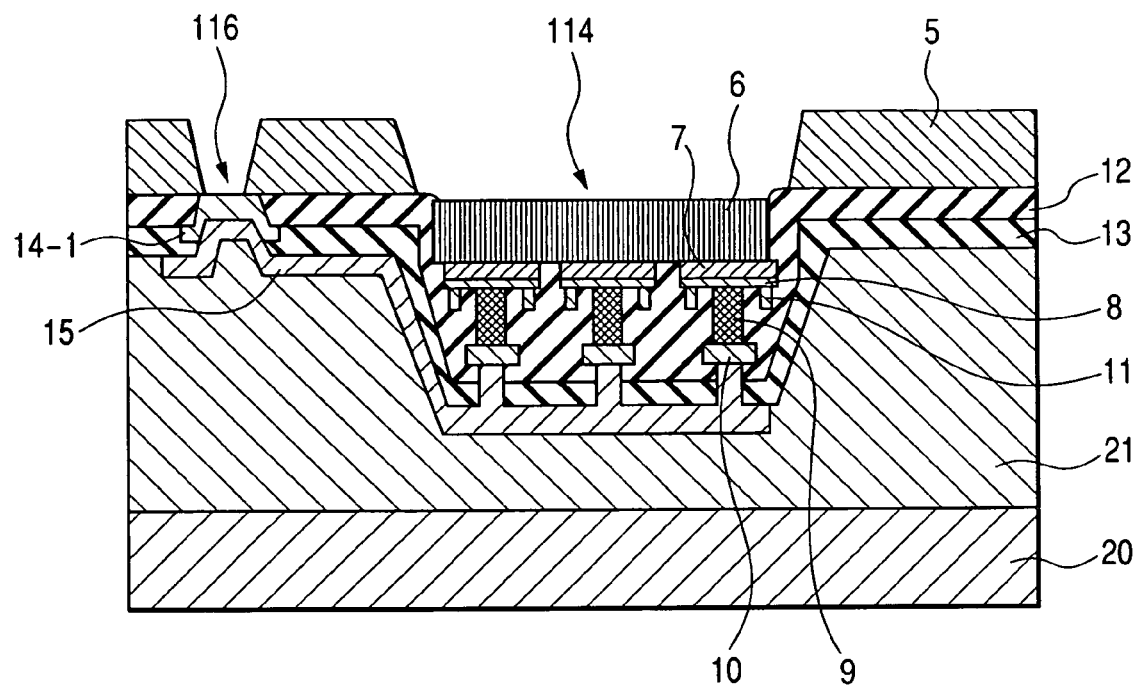
FIG. 16 is a cross-sectional view to show the sequence of steps performed to manufacture the collector top HBT-integrated semiconductor substrate according to the present invention.

Then, after the semi-insulation GaAs substrate 5 is attached face down to a glass plate 20 by an adhesive 21, the GaAs substrate 5 is thinned to a thickness of 50-70 µm by polishing. The emitter via hole 114, base via hole (not shown) and collector via hole 116 are formed by photolithography and wet etching with a mixture of sulfuric acid, peroxide and water (FIG. 16).

Figure 17:
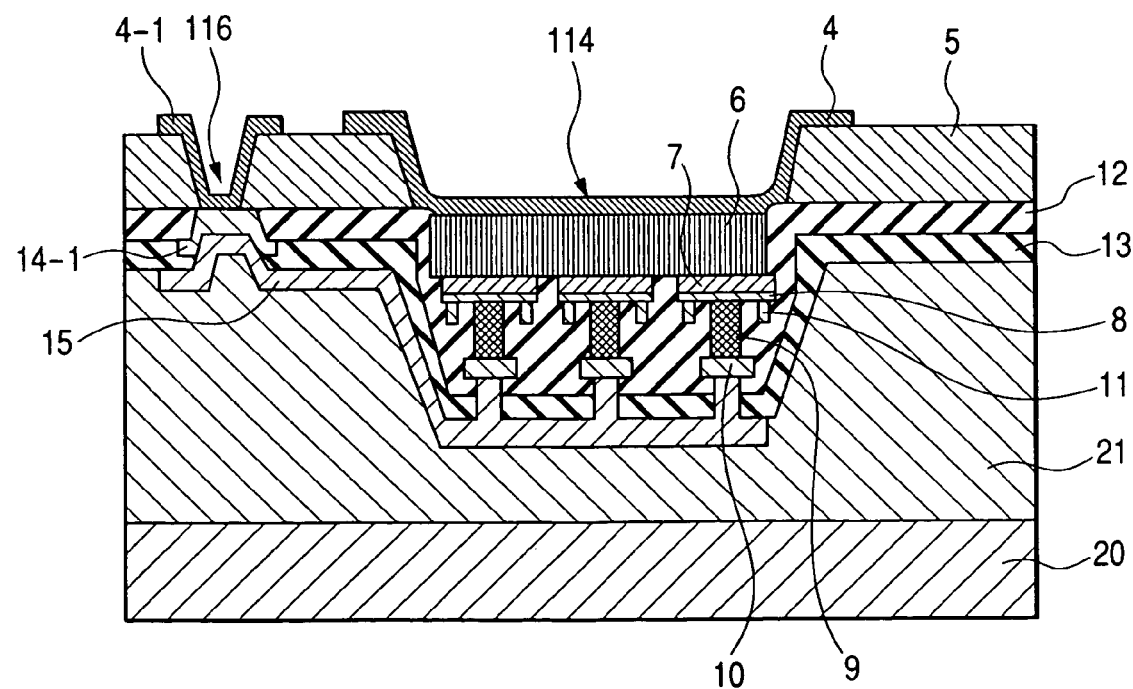
FIG. 17 is a cross-sectional view to show the sequence of steps performed to manufacture the collector top HBT-integrated semiconductor substrate according to the present invention.

Then, after an emitter electrode 4 and an electrode 4-1 are formed by electron beam evaporation of AuGe (thickness 60 nm)/Ni (thickness 10 nm)/Au (thickness 10 ìm), alloying is done in nitrogen atmosphere at 370° C. for 10 minutes (FIG. 17).

Figure 18:
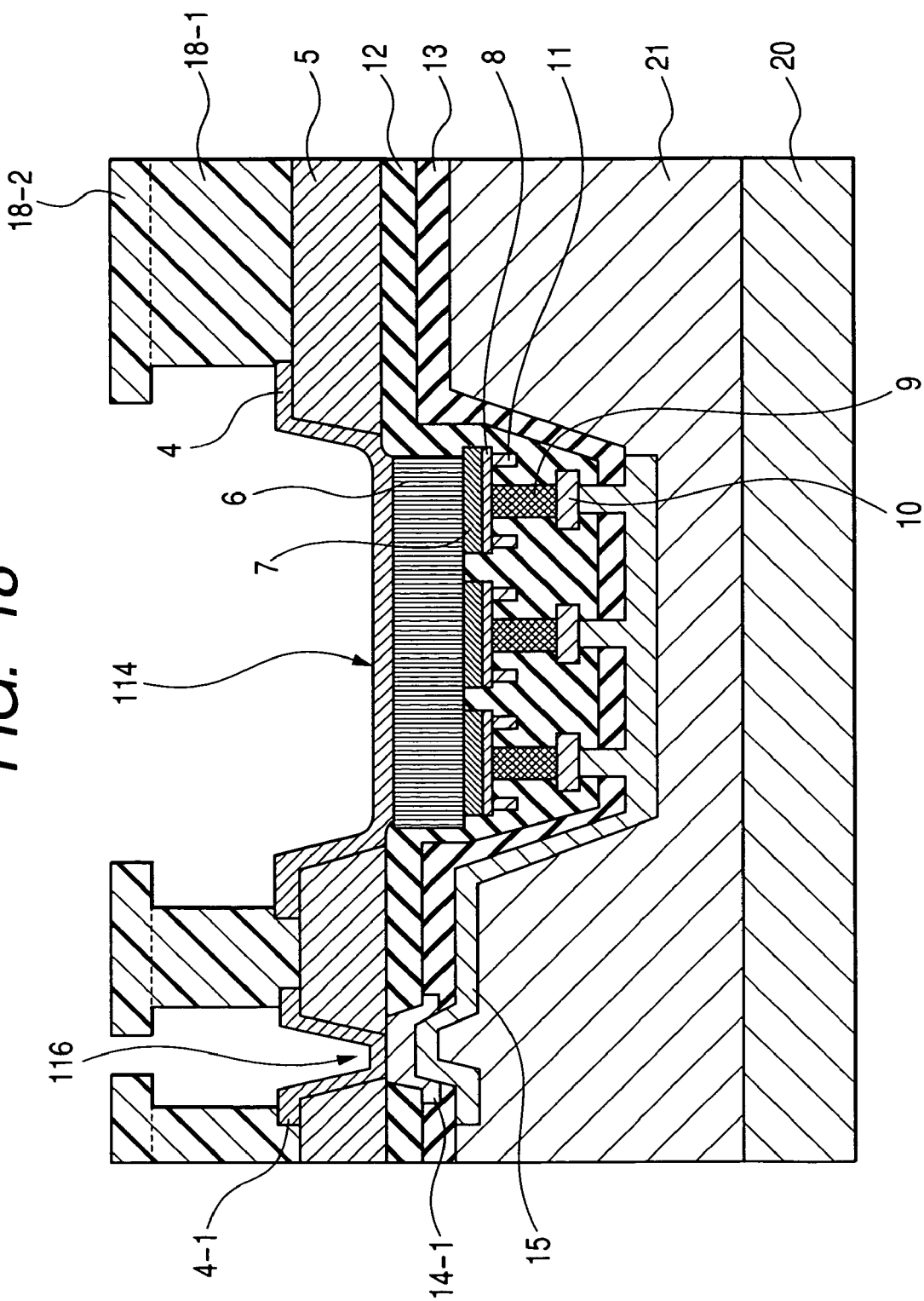
FIG. 18 is a cross-sectional view to show the sequence of steps performed to manufacture the collector top HBT-integrated semiconductor substrate according to the present invention.

Then, by using two kinds of resists 18-1 and 18-2 (which differ in optical sensitivity), photolithography is made to form a desired plating pattern (FIG. 18). In the subsequent figures, these two kinds of resists are shown as an single resist given reference numeral 18 for convenience.

Figure 19:
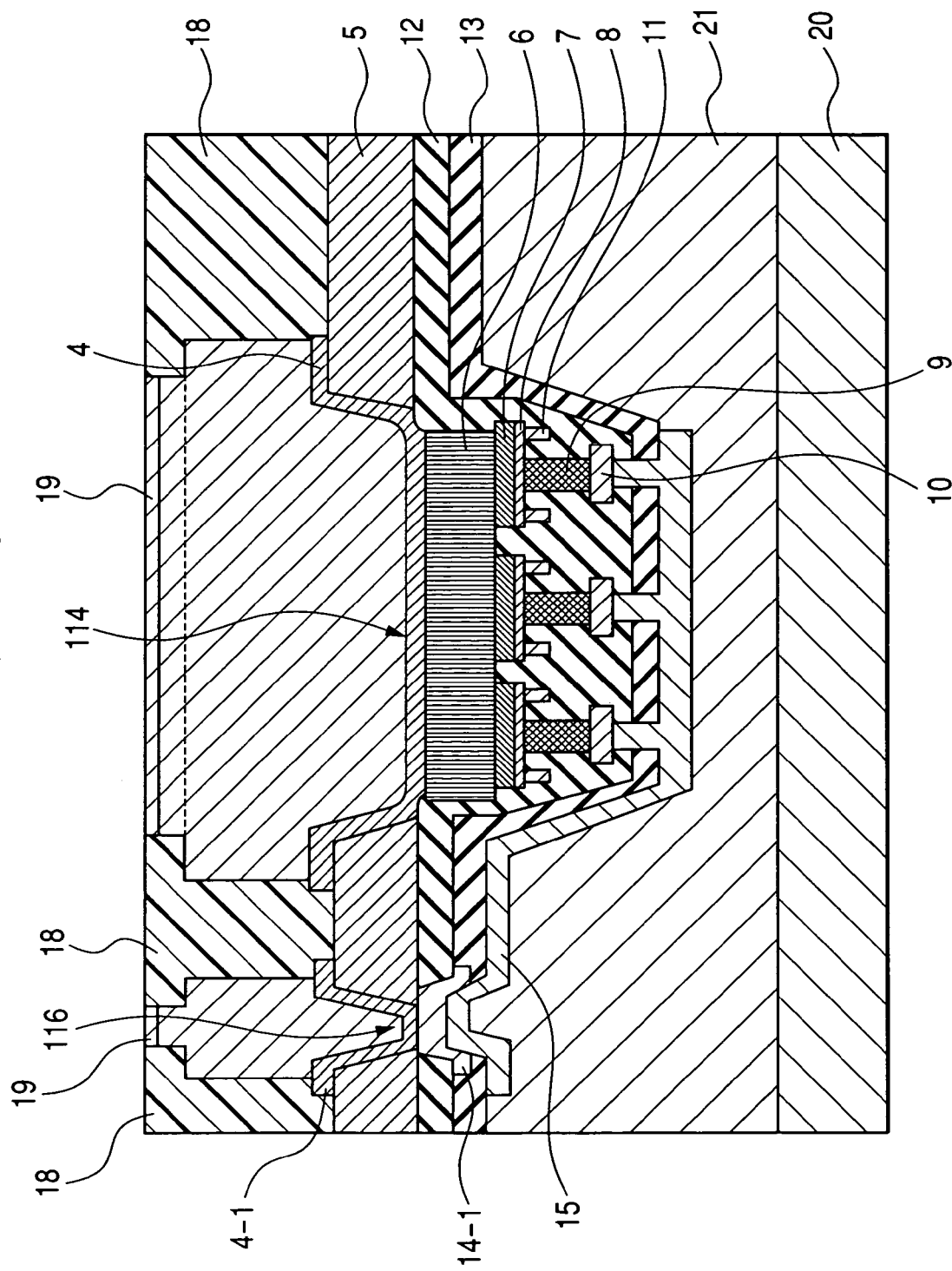
FIG. 19 is a cross-sectional view to show the sequence of steps performed to manufacture the collector top HBT-integrated semiconductor substrate according to the present invention.
Figure 20:
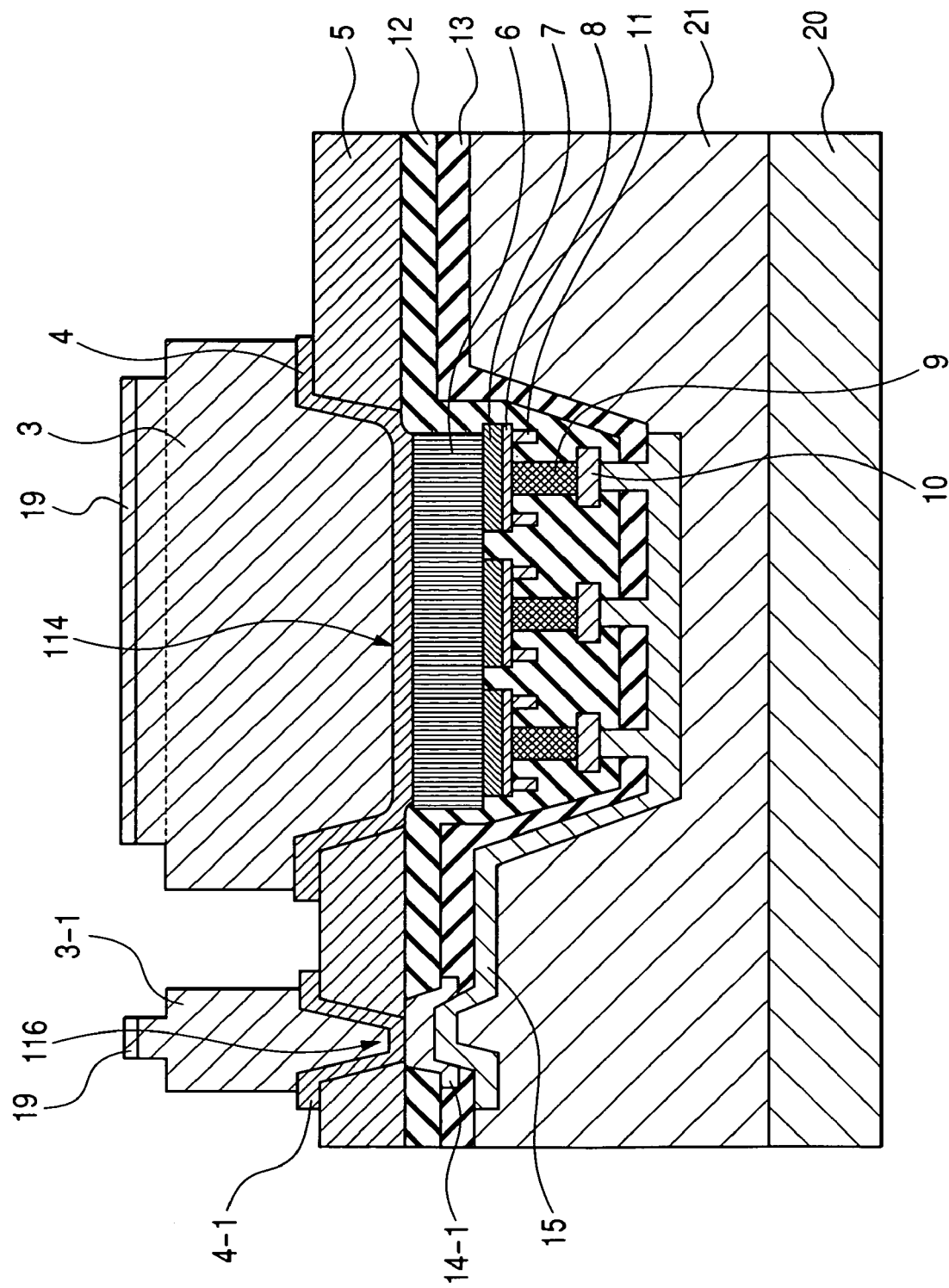
FIG. 20 is a cross-sectional view to show the sequence of steps performed to manufacture the collector top HBT-integrated semiconductor substrate according to the present invention.

Then, after the emitter via hole 114, base via hole (not shown) and collector via hole are filled simultaneously by electrolytic copper plating, their outermost surfaces are coated with tin (Sn) 19 by electrolytic plating (FIG. 19). Then, the dielectric film pattern is removed (FIG. 20).

Figure 21:
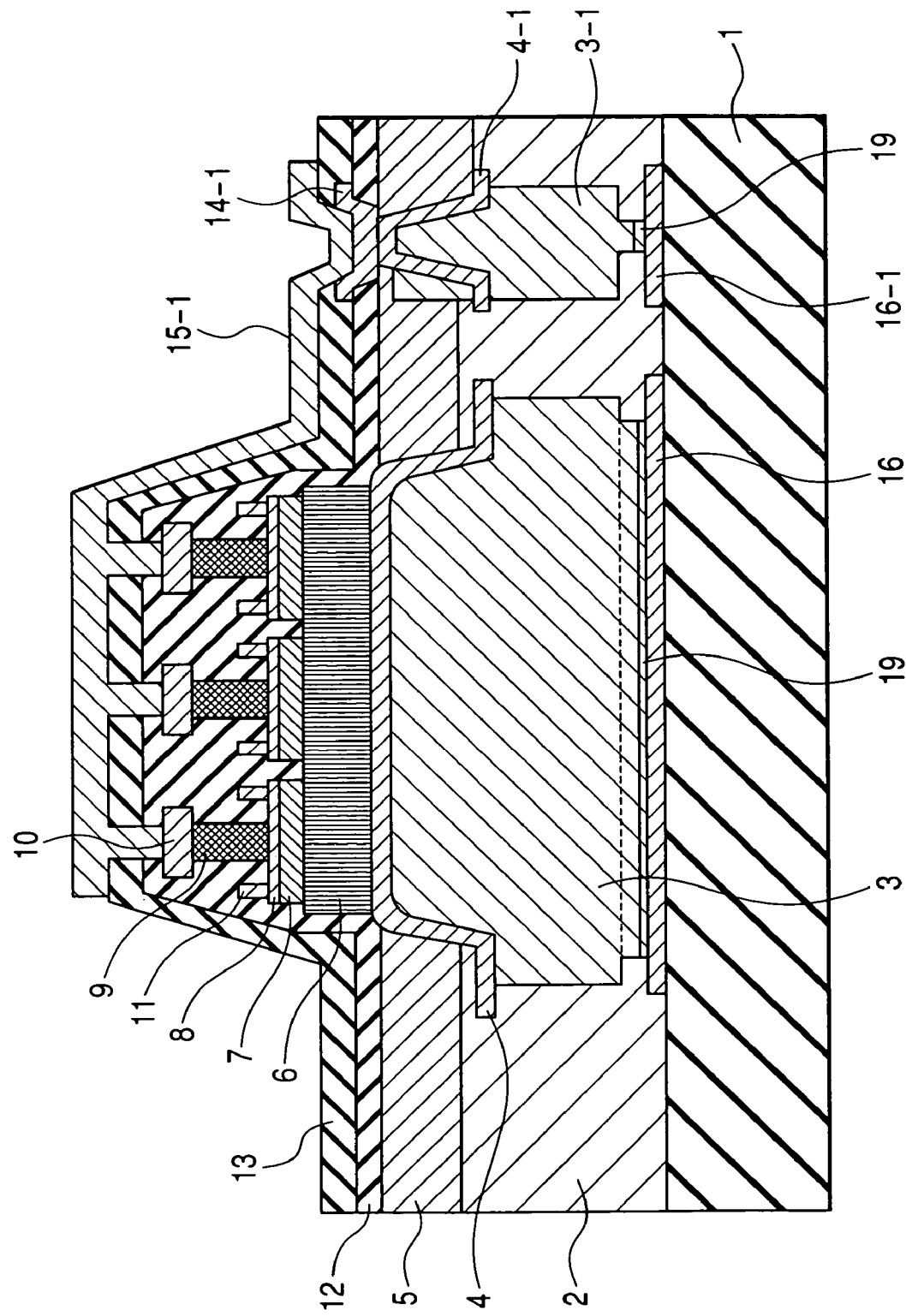
FIG. 21 is a cross-sectional view to show the sequence of steps performed to manufacture the collector top HBT-integrated semiconductor substrate according to the present invention.

Then, the MMIC (100) is removed from the glass plate and mounted on a module substrate 1. By thermo compression bonding, the bump electrodes 3 and 3-1 are respectively attached to electrodes 16 (specifically made of, for example, gold) and 16-1 (gold) on the module substrate 1 while the module substrate 1 is heated at 210° C. (FIG. 21).

According to this manufacturing method, it is possible to manufacture a semiconductor device which meets all requirements in mechanical strength, miniaturization and thermal stability and reliability. In addition, it is possible to manufacture such a semiconductor device at low cost since the via holes can be formed by the same process and the conductor layers (bump electrodes) for the via holes can be formed by extending the via hole plating process.

Embodiment 3

The following describes a power amplifier module embodiment which uses a different HBT-MMIC. The HBT-MMIC in this power amplifier module is made from an InP compound semiconductor, not a GaAs compound semiconductor used in Embodiment 1. Hereinafter, the HBT-MMIC which uses InP compound semiconductor material is simply denoted as "InPHBT-MMIC".

Basically, the InPHBT-MMIC has the same structure as that of Embodiment 1, namely the structure shown in FIGS. 4 and 5. In terms of materials, the back side electrode 4 is a Ti (thickness 50 nm)/Au (10 ìm) layer, the semiconductor substrate 5 is a semi-insulation InP substrate, the sub-emitter layer 6 is a highly doped n-type InGaAs layer (InAs molar ratio 0.5, Si concentration $2\times10^{19}$ cm$^{-3}$, thickness 0.8 ìm), the emitter layer 7 is a n-type InAlAs (InAs molar ratio 0.5, Si concentration $3\times10^{17}$ cm$^{-3}$, thickness 0.2 ìm), the base layer 8 is a p-type InGaAs (InAs molar ratio 0.5, C concentration $3\times10^{19}$ cm$^{-3}$, thickness 70 nm) and the collector layer 9 is a n-type InGaAsIn layer (thickness 0.8 ìm). In the n-type InGaAsIn collector layer 9, the As molar ratio is 0.5 and the Si concentration varies from $3\times10^{16}$ cm$^{-3}$ to $2\times10^{19}$ cm$^{-3}$. These layers are formed in the same manner as in Embodiment 1. That is, the layers 6 through 9 are formed by metalorganic vapor phase epitaxy and ion implantation. The HBT itself has the same basic structure as those described so far although a different semiconductor is used.

Figure 22:
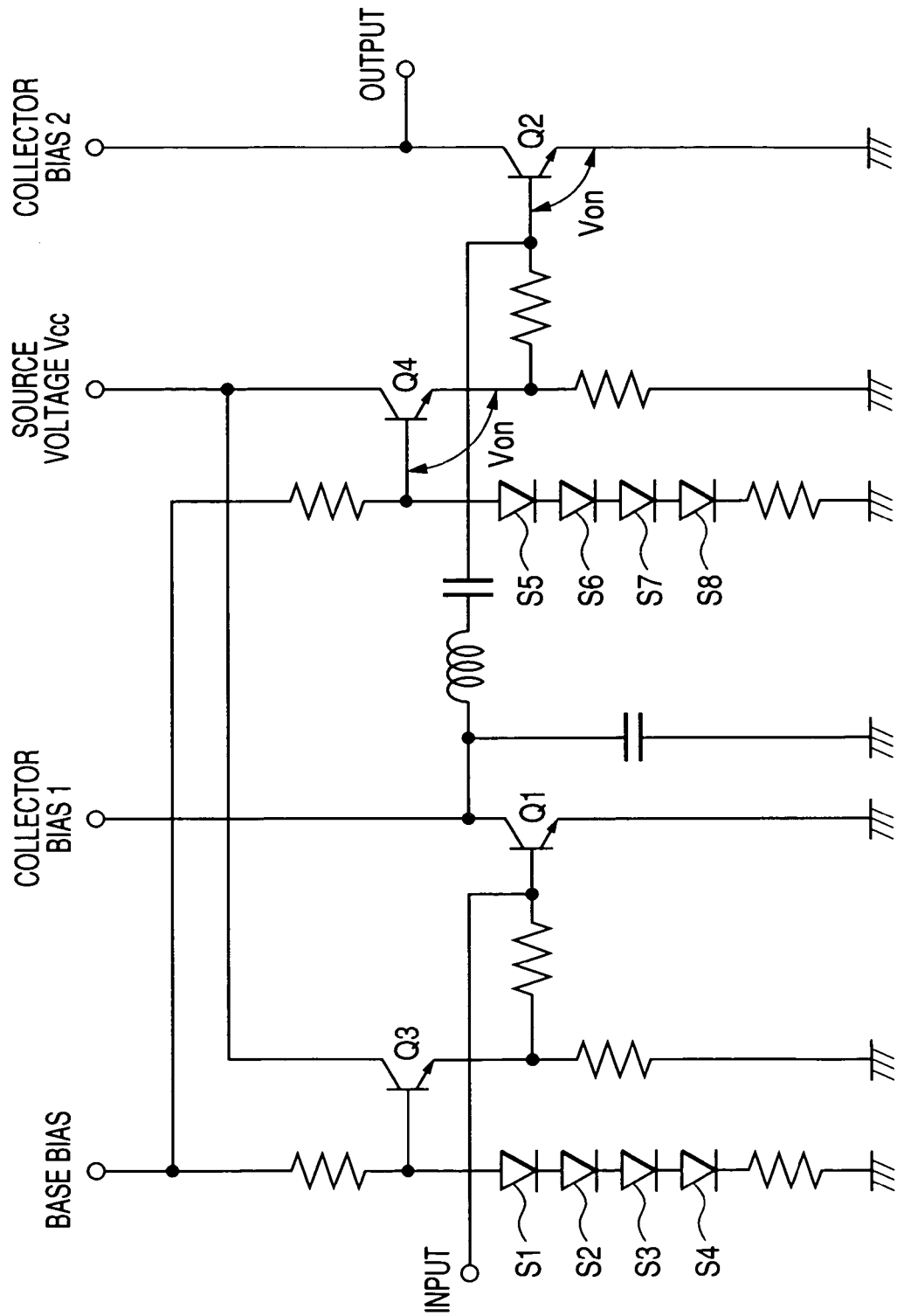
FIG. 22 shows the circuit configuration of an example of a power amplifier.

FIG. 22 is an equivalent circuit diagram of a typical power amplifier. When the power amplifier is used, the emitters of HBTs Q1 and Q2 are usually grounded as shown in FIG. 22. To facilitate the miniaturization of the MMIC and the power amplifier module, these HBTs should be not emitter up one but collector up ones to. This is because a collector up HBT allows the first via hole to be shared by the plural HBT fingers as a common back side emitter. In the case of an emitter up HBT, since it is not possible to share a common collector electrode, small via holes must be formed respectively for the fingers and the back side of the MMIC must have a wiring pattern to connect them, resulting in making the MMIC larger. Note that HBTs Q3 and Q4 in FIG. 22 are biasing transistors and their emitters are not grounded, and therefore, emitter top ones are employed as these HBTs.

According to this manufacturing method, it is possible to manufacture a semiconductor device which meets all requirements in mechanical strength, miniaturization and thermal stability and reliability.

<Comparison with Other Structures>

To facilitate understanding of the effect of the present invention, the following provides a practical description of what difficulties would arise when prior art structures are packaged.

Figure 23:
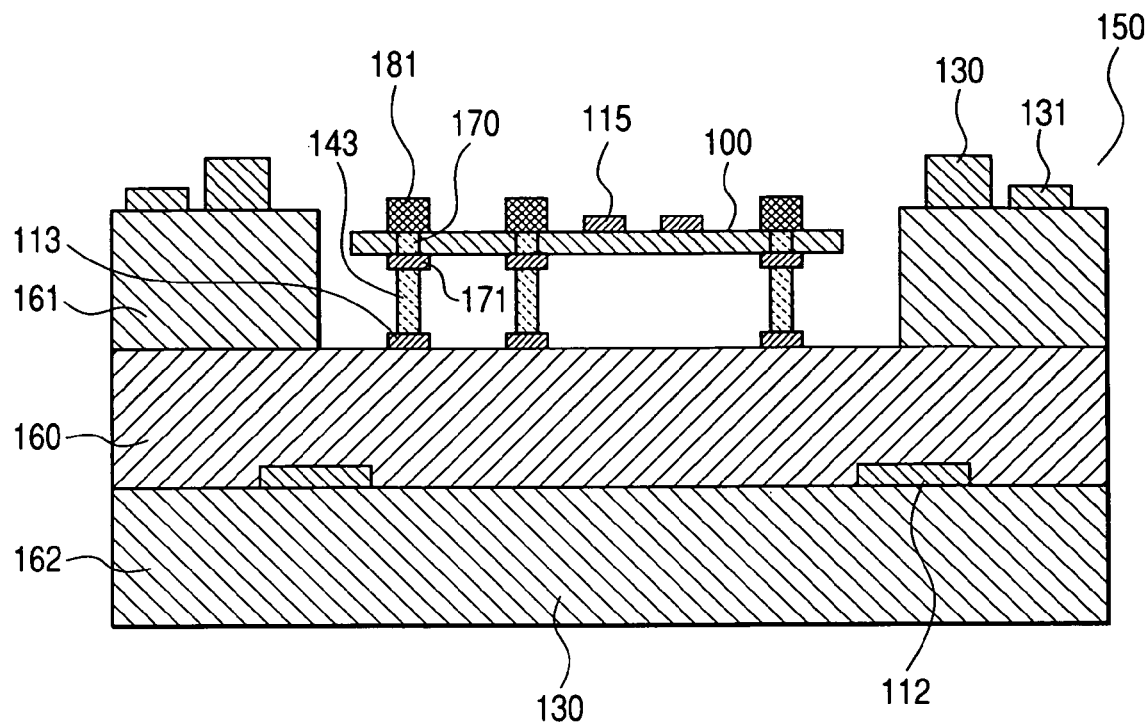
FIG. 23 is a cross-sectional view of a semiconductor module where a prior art semiconductor device is assumed.

Shown in FIG. 23 is a longitudinal cross sectional view of such a module we consider to be a typical example. This structure is similar to the optical element-used signal processor which is disclosed in Japanese Patent Laid-Open No. 1999-204449 (Patent Document 1). Reference numeral 100 refers to the semiconductor substrate of the MMIC. On the semiconductor substrate 100, optical elements 181 are mounted face up. Reference numeral 115 refers to a wiring line formed as appropriate on the semiconductor substrate. This signal processor is mounted on a three-layered substrate composed of layers 160, 161 and 162. The substrate layer 161 has an opening. The MMIC is located in this opening. Just below each optical element 181 of the MMIC, a via is formed 170. This via is filled with a conductor layer and provided with an electrode 171 in contact with the conductor layer. The electrode 171 is connected to an electrode 113 on the substrate of the signal processor module by way of a bump electrode 143. Usually, chip devices 130, transmission lines 131 and the like are located as appropriate on the substrate layer 161.

In the example of FIG. 23, the conductor layers 170 are formed only just below the optical elements 181 formed on the top side of the semiconductor substrate 100. The electrode 171 is located on the back side of the semiconductor substrate 100. Therefore, if the MMIC is designed to have other active or passive components, such as electrodes and wiring lines, formed on the back side of the semiconductor substrate 100, it is difficult to secure mechanical strength since the bump electrodes 143 can not be located at equal intervals. This is disadvantageous in terms of the reliability of the signal processor.

Another disadvantage with this interconnection method is that it involves many electrical connections which introduce electrical resistances and deteriorate the long range durability. Namely, between the lead-out electrode 171 of each optical element 181 and an electrode 113 on the substrate in the signal processor, there are two connections (170 to 171 and 171 to 143). In this electrical circuit, contact resistances are introduced in proportion to the number of connections. In addition, many junctions are also introduced disadvantageously in terms of durability.

Figure 24:
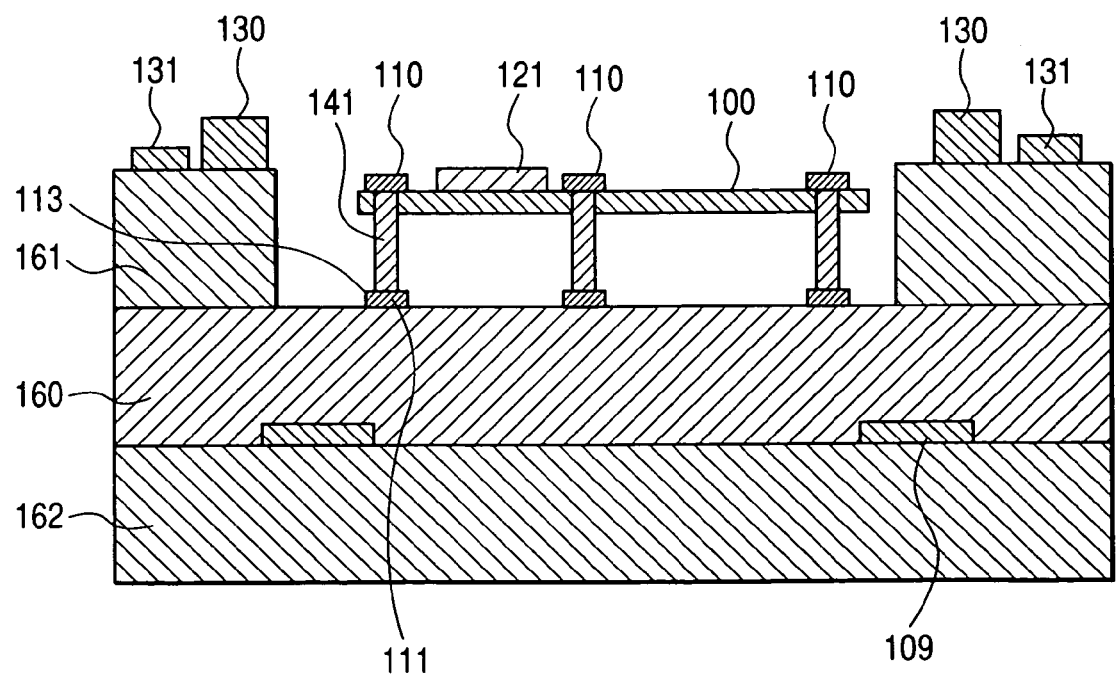
FIG. 24 is a cross-section view of another semiconductor module where a prior art semiconductor device is assumed.

FIG. 24 is a longitudinal cross sectional view of another example of a module structure. The structure of FIG. 24 is similar to the semiconductor device disclosed in Japanese Patent Laid-Open No. 2001-2106677 (Patent Document 2). Also in this example, the MMIC substrate 100 is mounted face up on the module substrate layer 160. The module substrate is a three-layered one composed of layers 161, 160 and 162. While wiring pads 111 and others are formed on the substrate layer 160, an active component 121 and others are formed on the semiconductor substrate 100. Conventionally, the module substrate 160, 161 and 162 uses low-temperature cofired glass ceramics with relative permeability 8. On the semiconductor substrate 100 of the MMIC, top side electrodes 110 are formed to connect the active component to the module substrate side. In addition, openings are formed respectively from the back side of the semiconductor substrate 100 toward the top side electrodes 110. Via bump electrodes through these openings, the top side electrodes 110 are connected to the corresponding wiring pads 111 formed on the module substrate layer 160.

Figure 25A:
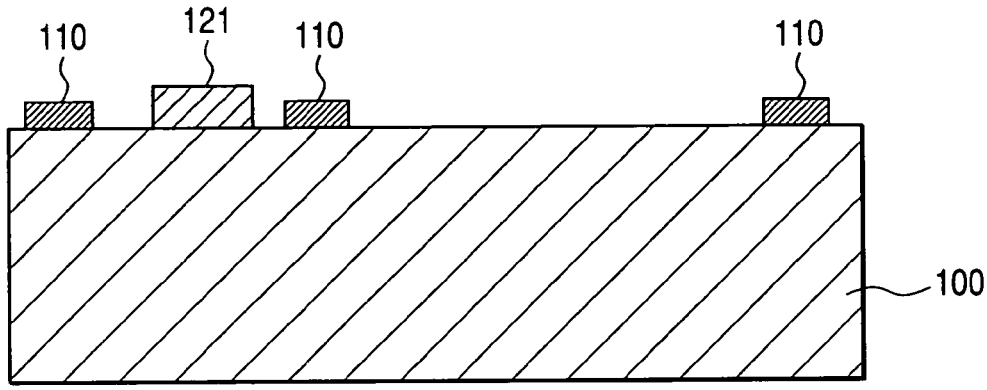
FIGS. 25A to 25C are cross-sectional views showing how the semiconductor device of FIG. 24 is mounted.
Figure 25B:
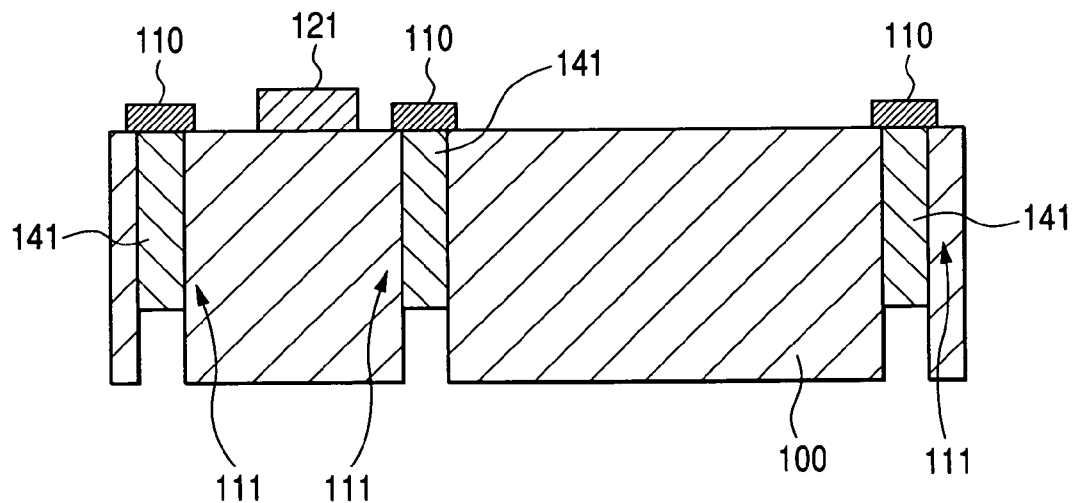
Figure 25C:
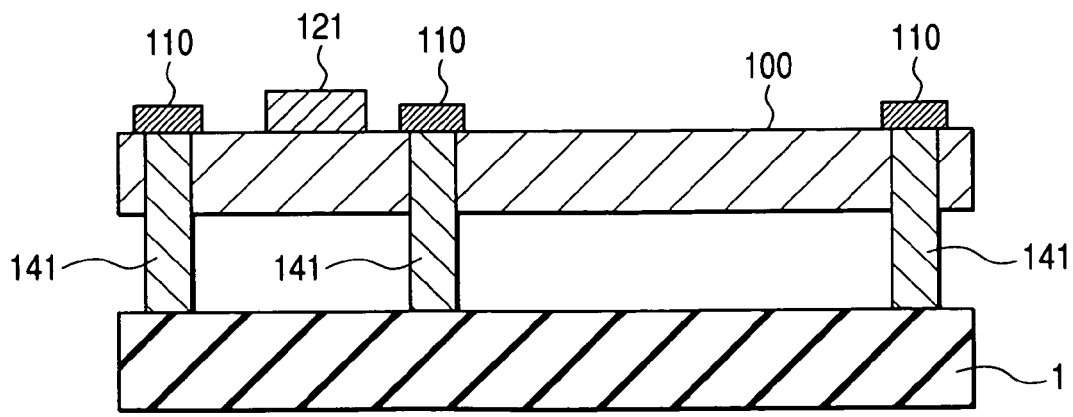

A typical method for manufacturing such a prior art structure of FIG. 24 is shown in FIG. 25. Firstly, a semiconductor substrate 100 provided with a desired active region formed thereon is prepared (FIG. 25A). The semiconductor substrate 100 has an active component 121 and top side electrodes 110 although its detailed structure, interconnections thereon and the like are not shown. Then, a through hole is formed below each top side electrode 110 by local dry-etching of the back side of the semiconductor substrate 100. Further, a conductor layer 141 is buried in this through hole (FIG. 25B). Then, the semiconductor substrate 100 is thinned by etching the back side. Consequently, the conductor layers 141 project from the semiconductor substrate 100 (FIG. 25C). These conductor layers 141 are bonded to the wiring pads 11 on the module substrate layer 160 as shown in the cross-sectional view of FIG. 24.

Apparently, the structure of FIG. 24 is equal to a structure of the present invention. However, if such a manufacturing method as mentioned above is employed, it is not possible to three-dimensionally arrange electrical members by using the back side of the semiconductor substrate 100. Namely, this is because new electrical members, such as passive devices and wiring lines, can not be formed on the back side of the semiconductor substrate 100 before the conductor layers 141 are formed. This is disadvantageous in terms of miniaturization of the module.

Furthermore, since the conductor layers 141 in the structure of FIG. 24 are formed just below the top side electrodes 110, not below the active and passive devices, the heat generated by the active component 121 and others can not be radiated efficiently to the outside. This may thermally make it impossible for the active component 121 to stably operate.

Since the present invention includes many embodiments, the following lists major embodiments of the present invention.

(1) A semiconductor device comprising a heterojunction bipolar transistor on the top side of the semiconductor substrate, a first via hole which is located on the back side of the semiconductor substrate so as to face the heterojunction bipolar transistor and a second via hole and a third via hole which are located on the back side of the semiconductor substrate so as not to face the heterojunction bipolar transistor.

(2) A semiconductor device according to paragraph (1) wherein the first, second and third via holes are filled with conductor layers.

(3) A semiconductor device according to paragraph (1) or (2) wherein the heterojunction bipolar transistor is of the collector up type, the first via hole is an emitter via hole and the second and third via holes are respectively a base via hole and a collector via hole.

(4) A semiconductor device according to any one of paragraph (1), (2) or (3) wherein the first via hole has an electrode formed on the back side of the semiconductor substrate, each of the second and third via holes has electrodes formed respectively on the top and back sides of the semiconductor substrate and the first, second and third via holes are electrically separated from each other.

(5) A semiconductor device according to paragraph (4) wherein the top side electrodes of the second and third via holes are respectively in contact with the semiconductor substrate.

(6) A semiconductor device according to paragraph (5) wherein the top side electrodes are made of WSiN or NiCr.

(7) A semiconductor device according to paragraph (4) wherein the top side electrodes are made of Mo/Au or Ti/Au.

(8) A semiconductor device according to paragraph (5) or (6) wherein the semiconductor substrate is a GaAs substrate and the back side electrodes of the first, second and third via holes respectively contain AuGe.

(9) A semiconductor device according to paragraph (5) or (6) wherein the semiconductor substrate is an InP substrate and the back side electrodes of the first, second and third via holes respectively contain Ti.

(10) A semiconductor device according to paragraph (1) wherein conductor layers for the second and third openings are formed in contact with the semiconductor substrate on the same side thereof as the side where the base, emitter and collector regions are formed.

(11) A method of manufacturing a semiconductor device in accordance with one of paragraphs (1) to (8), comprising the steps of: selectively exposing the semiconductor substrate; coating the whole surface with a dielectric film; selectively removing the dielectric film; and selectively removing the metal layer so that the area from which the dielectric film was selectively removed remains coated with the metal layer.

(12) A method of manufacturing a semiconductor device, comprising the steps of: preparing a semiconductor substrate having at least a semiconductor component formed thereon; exposing the semiconductor substrate except for the semiconductor component; coating the semiconductor substrate with a dielectric film; selectively removing the dielectric film from a desired area; coating the thus prepared semiconductor substrate with a first metal layer; selectively removing the first metal layer so that at least the area from which the dielectric film was selectively removed remains coated with the metal layer; forming an opening from the side of the semiconductor substrate, opposite to the side on which the metal layer is present, so that the opening faces the area where the metal layer is present; and filling the opening with a conductor layer.

(13) A semiconductor device manufacturing method according to paragraph (12), wherein the step of forming an opening from the side of the semiconductor substrate, includes the steps of:

forming an opening from the side opposite to the side on which the semiconductor component of the semiconductor substrate is mounted, toward the area where the semiconductor component is present; and filling the opening with a conductor layer.

(14) A semiconductor device manufacturing method according to paragraph (13) wherein the semiconductor component is a collector up heterojunction bipolar transistor, the opening is connected to the emitter region of the collector top heterojunction bipolar transistor, and at least two more openings are formed with metal layers, according to paragraph (12), which are respectively connected to the base and collector regions of the collector top heterojunction bipolar transistor;

wherein the openings are filled with a conductor layer from the side opposite to the side on which the metal layer of the semiconductor substrate is mounted, toward the area where the metal layer is present, the opening being associated with the base and collector; and wherein the openings are filled with a conductor layer from the side opposite to the side on which the semiconductor component of the semiconductor substrate is mounted, toward the area where the semiconductor component is present, the openings being associated with the respective emitter areas.

(15) A semiconductor manufacturing method according to paragraph (12) wherein the step of filling the opening with a conductor layer is to form two kinds of resist films differing in sensitivity, the resist films having desired shapes and the opening is filled with a conductor material.

(16) A semiconductor module which comprises a semiconductor substrate having a semiconductor component formed on a surface thereof and a module substrate, wherein conductor layers connected respectively to desired regions of the semiconductor component are brought out so as to come out from the opposite surface side of the semiconductor substrate and the ends of the conductor layers on the opposite surface side of the semiconductor substrate are electrically connected to metal pads on the module substrate.

(17) A semiconductor module according to paragraph (16) wherein the conductor layers are brought out via openings formed through the semiconductor substrate.

(18) A semiconductor module according to paragraph (17) wherein the ends of some of the conductor layers on the opposite surface side of the semiconductor substrate are bent so that the heights of the conductor layers from the opposite surface of the semiconductor substrate are made equal to each other.

(19) A semiconductor module according to paragraph (18) wherein the semiconductor component is a heterojunction bipolar transistor.

Explanation of reference numerals used in this specification is as follows:

1: 160, Module Substrate, 2: Dielectric Filler 3: 3-1, 3-2, 3-3, 3-4, Conductor Layer, 4: Electrode in Via Hole, 5: Semiconductor Substrate, 6: Sub-emitter Layer 7: Emitter Layer, 8: Base Layer, 9: Collector Layer 10: Collector Electrode, 11: Base Electrode 12: 13, Inter-layer Dielectric Layer 15: 15-1, 15-2, Wiring on Top Side of MMIC 16: Electrode on 1 (or 160), 17: High Resistance Region 100: MMIC, 130,130': Chip Device, 131: Transmission Line 141: 143, 144, 145, 146, Conductor Layer and Also Bump Electrode, 118: Base Input, 119: Collector Output 190: 191, 117, Ground Plane, 120: 171, Thermal Via 112: Bias Line, 147: Free Bump, 150: 113, Metal Cap 114: Emitter Via Hole, 115: Base Via Hole 116: Collector Via Hole, 121: Active component 110: 115, Top Side Electrode 160: 161, 162, Module Substrate 180: Active component, 120: 171, Back Side Electrode 170: Active component, 181: Optical Element 108: 110, 113, Electrode on Module Substrate 192: Passive Device, 200: Bonding Pad Electrode on MMIC 201: Bonding Pad Electrode on Module Substrate, 204: Wire

What is claimed is:

1. A semiconductor device comprising:

a semiconductor substrate;

a semiconductor component which is present on a first surface of the semiconductor substrate;

a first opening which extends between the first surface and a second surface of the semiconductor substrate and located so as to face the semiconductor component wherein the second surface is opposite to the first surface;

a first conductor layer with which the first opening is filled; and second conductor layers which are present on the second surface of the semiconductor substrate and located where the first opening and the first conductor layer are not present;

wherein at least the first conductor layer is electrically connected to the semiconductor component which is present on the first surface, wherein the first opening is also filled with a third conductive layer such that the third conductive layer is formed across a face of the first opening adjacent the first surface of the substrate such that a first surface of the third conductive layer faces the semiconductor component, wherein the third conductive layer also extends along sidewalls of the first opening between the first and second surfaces of the substrate, wherein the first conductor layer is formed on a second surface of the third conductor layer, which second surface is opposite to said first surface, so as to completely cover the portions of the third conductor layer formed within the first opening, including portions of the third conductor layer formed on the sidewalls of the first opening, and wherein the first conductor layer and the third conductor layer completely fill the first opening between the first and second surfaces of the substrate.

2. A semiconductor device according to claim 1 wherein each of the first and second conductor layers is made of two or more kinds of metal films.

3. A semiconductor device according to claim 1 wherein the first conductor layer protrudes from the first opening from the second surface of the semiconductor substrate to form a bump for electrical contact.

* * * * *